(12) United States Patent
Choi et al.

(10) Patent No.: US 11,980,097 B2
(45) Date of Patent: May 7, 2024

(54) THERMOELECTRIC ELEMENT

(71) Applicant: LG INNOTEK CO., LTD., Seoul (KR)

(72) Inventors: Man Hue Choi, Seoul (KR); Sue Kyung Oh, Seoul (KR); Jong Min Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 17/088,880

(22) Filed: Nov. 4, 2020

(65) Prior Publication Data
US 2021/0143308 A1 May 13, 2021

(30) Foreign Application Priority Data

Nov. 8, 2019 (KR) .................. 10-2019-0142682
Mar. 4, 2020 (KR) .................. 10-2020-0027382

(51) Int. Cl.
*H10N 10/17* (2023.01)
(52) U.S. Cl.
CPC .................. *H10N 10/17* (2023.02)
(58) Field of Classification Search
CPC .................. H01L 35/32; H10N 10/17
See application file for complete search history.

(56) References Cited

U.S. PATENT DOCUMENTS

| | | | |
|---|---|---|---|
| 3,110,628 A * | 11/1963 | Ramey, Jr. ............... | A62D 1/06 136/230 |
| 2003/0193087 A1* | 10/2003 | Hayashi ................. | H10N 10/17 257/712 |

(Continued)

FOREIGN PATENT DOCUMENTS

| | | |
|---|---|---|
| EP | 3 696 868 | 8/2020 |
| JP | 09-321348 | 12/1997 |

(Continued)

OTHER PUBLICATIONS

JP2006165457A—machine translation (Year: 2006).*

(Continued)

*Primary Examiner* — Tamir Ayad
(74) *Attorney, Agent, or Firm* — KED & ASSOCIATES, LLP

(57) ABSTRACT

A thermoelectric element according to one embodiment of the present disclosure includes a first metal substrate including a first through-hole formed therein, a first insulating layer disposed on the first metal substrate and including a second through-hole formed at a position corresponding to the first through-hole, a first electrode part disposed on the first insulating layer and including a plurality of first electrodes, a semiconductor structure disposed on the first electrode part, a second electrode part disposed on the semiconductor structure and including a plurality of second electrodes, a second insulating layer disposed on the second electrode part, and a second metal substrate disposed on the second insulating layer, wherein the first metal substrate includes a first outer periphery, a second outer periphery, a third outer periphery, and a fourth outer periphery which define a shape of the first metal substrate, the first outer periphery and the fourth outer periphery are opposite to each other, the second outer periphery and the third outer periphery are opposite to each other between the first outer periphery and the fourth outer periphery, the first electrode part includes a first region vertically overlapping the plurality of second electrodes, at least one of the plurality of first electrodes includes an extension portion extending toward the first outer periphery from the first region, the first through-hole is formed in an inside of the first region, and a shortest distance between the second outer periphery and a first electrode, which is closest to the second through-hole (Continued)

among the plurality of first electrodes, is within ±10% of a shortest distance between the second outer periphery and the extension portion.

20 Claims, 9 Drawing Sheets

(56) References Cited

U.S. PATENT DOCUMENTS

| | | | | |
|---|---|---|---|---|
| 2008/0163916 | A1* | 7/2008 | Tsuneoka | H01L 35/32 |
| | | | | 136/203 |
| 2009/0301540 | A1* | 12/2009 | Horio | H01L 35/30 |
| | | | | 136/204 |
| 2010/0252084 | A1* | 10/2010 | Konishi | H10N 10/17 |
| | | | | 136/200 |
| 2018/0261751 | A1 | 9/2018 | Angermann | |
| 2019/0044042 | A1 | 2/2019 | Nakada et al. | |
| 2020/0075828 | A1* | 3/2020 | Ghosal | H01L 35/08 |

FOREIGN PATENT DOCUMENTS

| | | | | |
|---|---|---|---|---|
| JP | 11-055974 | | 2/1999 | |
| JP | 2873961 | | 3/1999 | |
| JP | 11-220184 | | 8/1999 | |
| JP | 2000-164945 | | 6/2000 | |
| JP | 2004-055994 | | 2/2004 | |
| JP | 2004064015 A | * | 2/2004 | H01L 35/06 |
| JP | 2004-200262 | | 7/2004 | |
| JP | 2005-019792 | | 1/2005 | |
| JP | 2006165457 A | * | 6/2006 | H01L 35/10 |
| JP | 2007-036178 | | 2/2007 | |
| JP | 2007-073889 | | 3/2007 | |
| JP | 2009-295878 | | 12/2009 | |
| JP | 2016-072579 | | 5/2016 | |
| KR | 10-2018-0059830 A | | 6/2018 | |
| KR | 10-2018-0128726 | | 12/2018 | |
| KR | 10-2164983 | | 10/2020 | |
| WO | WO 2015/001523 | | 1/2015 | |

OTHER PUBLICATIONS

Machine translation, JP2004064015A (Year: 2004).*
Korean Office Action dated Jan. 12, 2021 issued in Application No. 10-2020-0128569.
European Search Report dated Mar. 9, 2021 issued in Application No. 20204264.4.
Korean Office Action dated Aug. 31, 2021 issued in Application 10-2021-0108928.
European Search Report dated Jan. 30, 2023 issued in Application No. 22199631.7.
Japanese Office Action dated Feb. 20, 2024, issued in Application No. JP 2020-181975.

* cited by examiner

200 : 210, 220, 230, 240, 250, 260, 270, 280

200 : 210, 220, 230, 240, 250, 260, 270, 280

200 : 210, 220, 230, 240, 250, 260, 270, 280

200 : 210, 220, 230, 240, 250, 260, 270, 280

THERMOELECTRIC ELEMENT

CROSS-REFERENCE TO RELATED APPLICATION

This application claims priority to and the benefit of Korean Patent Application No. 2019-0142682, filed on Nov. 8, 2019 and No. 2020-0027382, filed on Mar. 4, 2020, the disclosure of which is incorporated herein by reference in its entirety.

BACKGROUND

1. Field of the Invention

The present disclosure relates to a thermoelectric element, and more particularly, to a substrate and an electrode structure of a thermoelectric element.

2. Discussion of Related Art

A thermoelectric phenomenon is a phenomenon occurring due to movement of electrons and holes in a material and means direct energy conversion between heat and electricity.

A thermoelectric element is a generic term for elements in which the thermoelectric phenomenon is used and has a structure in which P-type thermoelectric materials and N-type thermoelectric materials are joined between metal electrodes to form PN junction pairs.

The thermoelectric elements may be divided into elements which use a change in electrical resistance according to a change in temperature, elements which use the Seebeck effect in which an electromotive force is generated due to a difference in temperature, and elements which use the Peltier effect in which heat absorption or heating occurs due to a current.

The thermoelectric elements are being variously applied to home appliances, electronic components, communication components, and the like. For example, the thermoelectric elements may be applied to cooling devices, heating devices, power generation devices, and the like. Accordingly, the demand for thermoelectric performance of the thermoelectric elements is gradually increasing.

The thermoelectric element includes substrates, electrodes, and thermoelectric legs, wherein a plurality of thermoelectric legs are disposed between an upper substrate and a lower substrate, a plurality of upper electrodes are disposed between the upper substrate and the plurality of thermoelectric legs, and a plurality of lower electrodes are disposed between the plurality of thermoelectric legs and the lower substrate.

Attempts to use metal substrates to improve the heat transfer performance of the thermoelectric element are increasing.

In general, a thermoelectric element may be manufactured according to a process of sequentially stacking electrodes and thermoelectric legs on a metal substrate prepared in advance. In a case in which the metal substrate is used, advantageous effects may be obtained in terms of thermal conduction, but in an application field under a high-voltage environment, there is a problem in that withstand voltage characteristics need to be additionally secured.

SUMMARY OF THE INVENTION

The present disclosure is directed to providing a thermoelectric element in which thermal conduction performance, withstand voltage performance, and insulation resistance are all improved.

According to an aspect of the present disclosure, there is provided a thermoelectric element including a first metal substrate including a first through-hole formed therein, a first insulating layer disposed on the first metal substrate and including a second through-hole formed at a position corresponding to the first through-hole, a first electrode part disposed on the first insulating layer and including a plurality of first electrodes, a semiconductor structure disposed on the first electrode part, a second electrode part disposed on the semiconductor structure and including a plurality of second electrodes, a second insulating layer disposed on the second electrode part, and a second metal substrate disposed on the second insulating layer, wherein the first metal substrate includes a first outer periphery, a second outer periphery, a third outer periphery, and a fourth outer periphery which define a shape of the first metal substrate, the first outer periphery and the fourth outer periphery are opposite to each other, the second outer periphery and the third outer periphery are opposite to each other between the first outer periphery and the fourth outer periphery, the first electrode part includes a first region vertically overlapping the plurality of second electrodes, at least one of the plurality of first electrodes includes an extension portion extending toward the first outer periphery from the first region, the first through-hole is formed in an inside of the first region, and a shortest distance between the second outer periphery and a first electrode, which is closest to the second through-hole among the plurality of first electrodes, is within ±10% of a shortest distance between the second outer periphery and the extension portion.

A first hole arrangement region may be formed in the inside of the first region, the first hole arrangement region may be a space formed by virtual lines connecting surfaces of the first electrodes, which are adjacent to the second through-hole, among the plurality of first electrodes surrounding a periphery of the second through-hole, and the extension portion may be disposed so that at least a portion thereof overlaps a virtual space formed by extension lines extending from the virtual lines that define the first hole arrangement region.

A shortest distance between the first region and the first outer periphery may be 1.2 to 2.5 times the shortest distance between the second outer periphery and the extension portion.

The shortest distance between the second outer periphery and the extension portion may be greater than or equal to 12 mm.

A shortest distance between an edge of the second through-hole and the first electrode, which is closest to the edge of the second through-hole among the plurality of first electrodes, may be 50 to 180 times a thickness of the first insulating layer.

The shortest distance between the edge of the second through-hole and the first electrode, which is closest to the edge of the second through-hole among the plurality of first electrodes, may be greater than or equal to 8 mm.

The second insulating layer may include a third through-hole formed at a position corresponding to the first through-hole, the second metal substrate may include a fourth through-hole formed at a position corresponding to the first through-hole, and the thermoelectric element may further include a coupling member disposed between the first through-hole and the fourth through-hole.

The thermoelectric element may further include a heat sink disposed on the second metal substrate and include a fifth through-hole formed at a position corresponding to the first through-hole.

The coupling member may be disposed between the fourth through-hole and the fifth through-hole, and the thermoelectric element may further include an insulating insertion member disposed to be adjacent to the fifth through-hole on the heat sink.

A portion of the insulating insertion member may be disposed between the fourth through-hole and the coupling member.

A diameter of the fourth through-hole may be 1.1 to 2.0 times a diameter of the first through-hole.

The thermoelectric element may further include a third insulating layer disposed between the first insulating layer and the first electrode part and including a sixth through-hole formed at a position corresponding to the first through-hole.

At least one of the first insulating layer, the second insulating layer, and the third insulating layer may include a resin and an inorganic material.

The inorganic material may include aluminum or aluminum oxide.

An area of the first hole arrangement region may be four times or more an area of one first electrode.

A plurality of extension portions may be provided, the plurality of extension portions may include a first terminal electrode and a second terminal electrode, a first connection unit may be disposed on the first terminal electrode, and a second connection unit may be disposed on the second terminal electrode.

Each of the first connection unit and the second connection unit may be a connector connected to an electric wire.

According to another aspect of the present disclosure, there is provided a power generation device including a first fluid flow part in which a first fluid flows, a second fluid flow part in which a second fluid having a higher temperature than the first fluid flows, and a thermoelectric element disposed between the first fluid flow part and the second fluid flow part, wherein the thermoelectric element includes a first metal substrate including a first through-hole formed therein, a first insulating layer disposed on the first metal substrate and including a second through-hole formed at a position corresponding to the first through-hole, a first electrode part disposed on the first insulating layer and including a plurality of first electrodes, a semiconductor structure disposed on the first electrode part, a second electrode part disposed on the semiconductor structure and including a plurality of second electrodes, a second insulating layer disposed on the second electrode part, and a second metal substrate disposed on the second insulating layer, wherein the first metal substrate includes a first outer periphery, a second outer periphery, a third outer periphery, and a fourth outer periphery which define a shape of the first metal substrate, the first outer periphery and the fourth outer periphery are opposite to each other, the second outer periphery and the third outer periphery are opposite to each other between the first outer periphery and the fourth outer periphery, the first electrode part includes a first region vertically overlapping the plurality of second electrodes, at least one of the plurality of first electrodes includes an extension portion extending toward the first outer periphery from the first region, the first through-hole is formed in an inside of the first region, and a shortest distance between the second outer periphery and a first electrode, which is closest to the second through-hole among the plurality of first electrodes, is within ±10% of a shortest distance between the second outer periphery and the extension portion.

The shortest distance between the second outer periphery and the extension portion may be greater than or equal to 12 mm.

A shortest distance between an edge of the second through-hole and the first electrode, which is closest to the edge of the second through-hole among the plurality of first electrodes, may greater than or equal to 8 mm.

BRIEF DESCRIPTION OF THE DRAWINGS

The above and other objects, features, and advantages of the present disclosure will become more apparent to those of ordinary skill in the art by describing exemplary embodiments thereof in detail with reference to the accompanying drawings, in which.

DETAILED DESCRIPTION OF EXEMPLARY EMBODIMENTS

Hereinafter, exemplary embodiments of the present disclosure will be described in detail with reference to the accompanying drawings.

However, the technical spirit of the present disclosure is not limited to some embodiments which will be described and may be embodied in various forms, and one or more elements in the embodiments may be selectively combined and replaced to be used within the scope of the technical spirit of the present disclosure.

Further, the terms used in the embodiments of the present disclosure (including technical and scientific terms), may be interpreted with meanings that are generally understood by those skilled in the art unless particularly defined and described, and terms which are generally used, such as terms defined in a dictionary, may be understood in consideration of their contextual meanings in the related art.

Further, the terms used in the embodiments of the present disclosure are provided only to describe embodiments of the present disclosure and not for purposes of limitation.

In the present specification, unless clearly indicated otherwise by the context, singular forms include the plural forms thereof, and in a case in which "at least one (or one or more) among A, B, and C" is described, this may include at least one combination among all combinations which can be combined with A, B, and C.

In addition, terms such as first, second, A, B, (a), (b), and the like may be used to describe elements of the embodiments of the present disclosure.

These terms are only provided to distinguish the elements from other elements, and the essence, sequence, order, or the like of the elements are not limited by the terms.

In addition, when an element is described as being "connected," "coupled," or "linked" to another element, the element may include not only a case of being directly connected, coupled, or linked to another element but also a case of being connected, coupled, or linked to another element by still another element between the element and another element.

Further, when an element is described as being formed "on (above)" or "under (below)" another element, the term "on (above)" or "under (below)" includes both of a case in which two elements are in direct contact with each other or a case in which one or more elements are (indirectly) disposed between two elements. In addition, when an element is described as being disposed "on or under" another element, such a description may include a case in which the element is disposed at an upper side or a lower side with respect to another element.

Figure 1A:
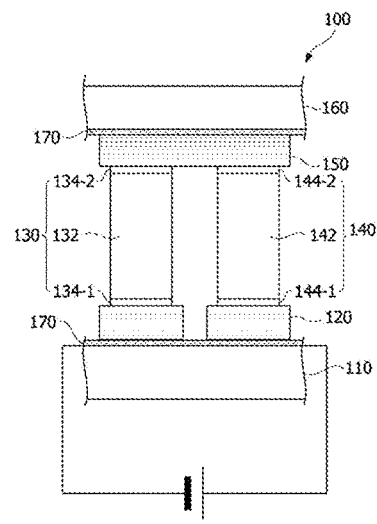
FIGS. 1A and 1B are cross-sectional views of a thermoelectric element.
Figure 1B:
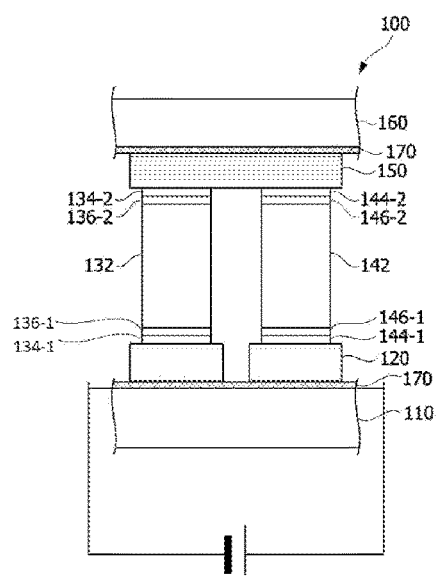
Figure 2:
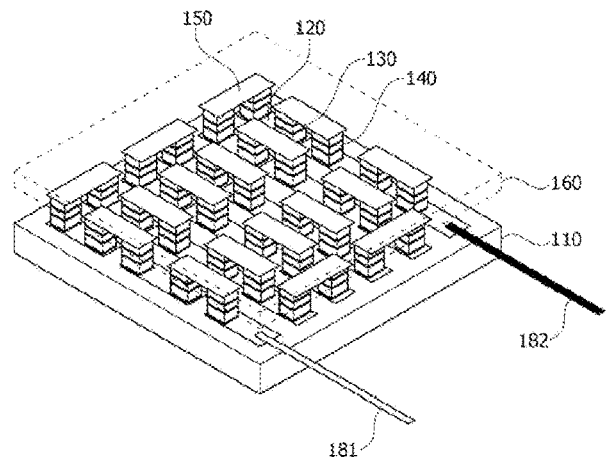
FIG. 2 is a perspective view of the thermoelectric element.
Figure 3:
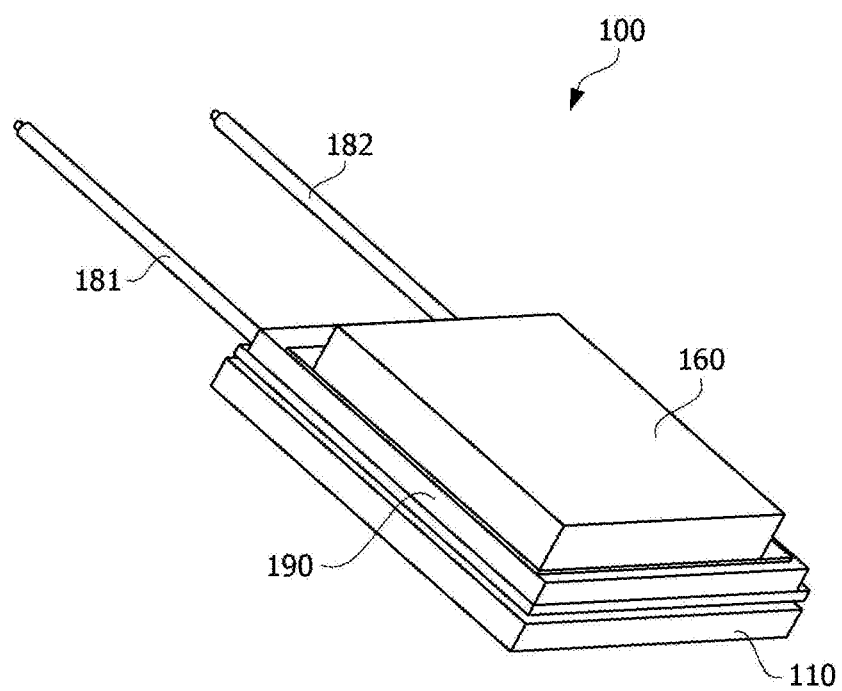
FIG. 3 is a perspective view of the thermoelectric element including a sealing member.
Figure 4:
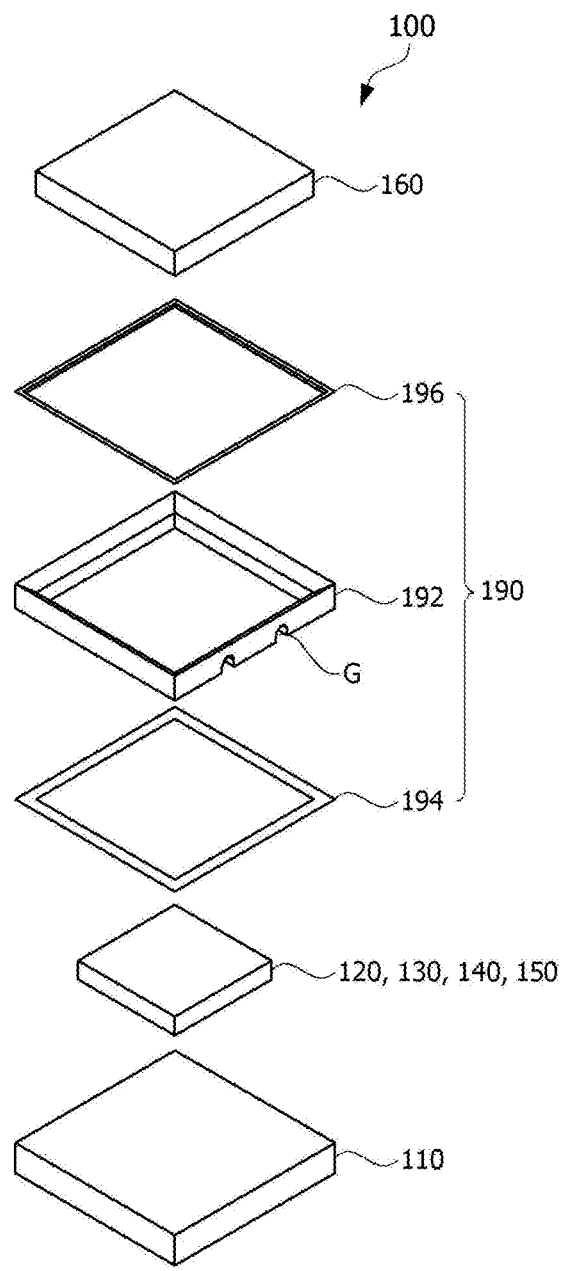
FIG. 4 is an exploded perspective view of the thermoelectric element including the sealing member.

FIGS. 1A and 1B are cross-sectional views of a thermoelectric element, and FIG. 2 is a perspective view of the thermoelectric element. FIG. 3 is a perspective view of the thermoelectric element including a sealing member, and FIG. 4 is an exploded perspective view of the thermoelectric element including the sealing member.

Referring to FIGS. 1A, 1B and 2, a thermoelectric element 100 includes a lower substrate 110, lower electrodes 120, P-type thermoelectric legs 130, N-type thermoelectric legs 140, upper electrodes 150, and an upper substrate 160.

The lower electrodes 120 are disposed between the lower substrate 110 and lower surfaces of the P-type thermoelectric legs 130 and the N-type thermoelectric legs 140, and the upper electrodes 150 are disposed between the upper substrate 160 and upper surfaces of the P-type thermoelectric legs 130 and the N-type thermoelectric legs 140. Accordingly, a plurality of P-type thermoelectric legs 130 and a plurality of N-type thermoelectric legs 140 are electrically connected by the lower electrodes 120 and the upper electrodes 150. A pair of the P-type thermoelectric leg 130 and the N-type thermoelectric leg 140, which are disposed between the lower electrode 120 and the upper electrode 150 and electrically connected to each other, may form a unit cell.

For example, when a voltage is applied between the lower electrode 120 and the upper electrode 150 through lead wires 181 and 182, due to the Peltier effect, the substrate through which a current flows from the P-type thermoelectric leg 130 to the N-type thermoelectric leg 140 may absorb heat and thus serve as a cooling part, and the substrate through which a current flows from the N-type thermoelectric leg 140 to the P-type thermoelectric leg 130 may be heated and thus serve as a heating part. Alternatively, when a temperature difference is provided between the lower electrode 120 and the upper electrode 150, due to the Seebeck effect, charges in the P-type thermoelectric leg 130 and the N-type thermoelectric leg 140 move, and thus electricity may be produced.

Here, the P-type thermoelectric leg 130 and the N-type thermoelectric leg 140 may be bismuth-telluride (Bi—Te)-based thermoelectric legs including bismuth (Bi) and tellurium (Te) as main raw materials. The P-type thermoelectric leg 130 may be a Bi—Te-based thermoelectric leg including at least one among antimony (Sb), nickel (Ni), aluminum (Al), copper (Cu), silver (Ag), lead (Pb), boron (B), gallium (Ga), tellurium (Te), bismuth (Bi), and indium (In). For example, the P-type thermoelectric leg 130 may include a Bi—Sb—Te-based main raw material in a range of 99 to 99.999 wt % and a material including at least one among Ni, Al, Cu, Ag, Pb, B, Ga, and In in a range of 0.001 to 1 wt % based on a total weight of 100 wt %. The N-type thermoelectric leg 140 may be a Bi—Te-based thermoelectric leg including at least one among selenium (Se), Ni, Al, Cu, Ag, Pb, B, Ga, Te, Bi, and In. For example, the N-type thermoelectric leg 140 may include a Bi—Se—Te-based main raw material in a range of 99 to 99.999 wt % and a material including at least one among Ni, Al, Cu, Ag, Pb, B, Ga, and In in a range of 0.001 to 1 wt % based on a total weight of 100 wt %.

The P-type thermoelectric leg 130 and the N-type thermoelectric leg 140 may be formed as a bulk type or a stacked type. Generally, the bulk type P-type thermoelectric leg 130 or the bulk type N-type thermoelectric leg 140 may be obtained through a process of performing a thermal process on a thermoelectric material to manufacture an ingot, crushing and sieving the ingot to obtain a powder for a thermoelectric leg, sintering the powder, and cutting a sintered body. Here, the P-type thermoelectric leg 130 and the N-type thermoelectric leg 140 may be polycrystalline thermoelectric legs. In order to obtain the polycrystalline thermoelectric legs, the powder for a thermoelectric leg may be compressed at a pressure of 100 MPa to 200 MPa when sintered. For example, when the P-type thermoelectric leg 130 is sintered, the powder for a thermoelectric leg may be sintered at a pressure of 100 to 150 MPa, preferably 110 to 140 MPa, and more preferably 120 to 130 MPa. In addition, when the N-type thermoelectric leg 140 is sintered, the powder for a thermoelectric leg may be sintered at a pressure of 150 to 200 MPa, preferably 160 to 195 MPa, and more preferably 170 to 190 MPa. As described above, when the P-type thermoelectric leg 130 and the N-type thermoelectric leg 140 are polycrystalline thermoelectric legs, the strength of each of the P-type thermoelectric leg 130 and the N-type thermoelectric leg 140 may be increased. The stacked type P-type thermoelectric leg 130 or the stacked type N-type thermoelectric leg 140 may be obtained through a process of coating a sheet-shaped base with a paste including a thermoelectric material to form unit members, stacking the unit members, and cutting the stacked unit members.

Here, the pair of P-type thermoelectric leg 130 and N-type thermoelectric leg 140 may have the same shape and volume or may have different shapes and volumes. For example, since electrical conduction properties of the P-type thermoelectric leg 130 and the N-type thermoelectric leg 140 are different, a height or cross-sectional area of the N-type thermoelectric leg 140 may be formed to be different from that of the P-type thermoelectric leg 130.

Here, the P-type thermoelectric leg 130 or the N-type thermoelectric leg 140 may have a cylindrical shape, a polygonal column shape, an elliptical column shape, or the like.

Alternatively, the P-type thermoelectric leg 130 or the N-type thermoelectric leg 140 may have a stacked type structure. For example, the P-type thermoelectric leg or the N-type thermoelectric leg may be formed by a method of stacking a plurality of structures each having a sheet-shaped base coated with a semiconductor material and then cutting the plurality of structures. Thus, it is possible to prevent the loss of a material and improve electrical conduction properties. Each of the structures may further include a conductive layer having an opening pattern, thereby increasing adhesion between the structures, lowering thermal conductivity, and increasing electrical conductivity.

Alternatively, the P-type thermoelectric leg 130 or the N-type thermoelectric leg 140 may be formed so that sectional areas thereof are different within one thermoelectric leg. For example, in one thermoelectric leg, sectional areas of both end portions each disposed to face the electrode may be formed to be greater than a sectional area between the both end portions. Accordingly, a great temperature difference may be formed between the both end portions, and thus thermoelectric efficiency may be improved.

Performance of the thermoelectric element according to one embodiment of the present disclosure may be represented by a figure of merit ZT. The figure of merit ZT may be expressed by Equation 1, $$ZT=\alpha^2 \cdot \sigma \cdot T/k \qquad \text{Equation 1}$$

where $\alpha$ is the Seebeck coefficient [V/K], $\sigma$ is electrical conductivity [S/m], and $\alpha^2\sigma$ is a power factor [W/mK$^2$]. In addition, T is temperature and k is thermal conductivity [W/mK]. k may be expressed as $a \cdot cp \cdot \rho$, wherein a is thermal diffusivity [cm$^2$/S], cp is specific heat [J/gK], and $\rho$ is density [g/cm$^3$].

In order to obtain a figure of merit of a thermoelectric element, a Z value [V/K] is measured using a Z meter, and the figure of merit ZT may be calculated using the measured Z value.

Here, the lower electrode 120 disposed between the lower substrate 110 and the P-type thermoelectric leg 130 and the N-type thermoelectric leg 140, and the upper electrode 150 disposed between the upper substrate 160 and the P-type thermoelectric leg 130 and the N-type thermoelectric leg 140 may include at least one among Cu, Ag, Al, and Ni and have a thickness of 0.01 mm to 0.3 mm. When the thickness of the lower electrode 120 or the upper electrode 150 is less than 0.01 mm, the function thereof as an electrode decreases and thus electrical conduction performance may be degraded, and, when the thickness thereof exceeds 0.3 mm, conduction efficiency may be degraded due to an increase in resistance.

In addition, the lower substrate 110 and the upper substrate 160 facing each other may be metal substrates and may each have a thickness of 0.1 mm to 1.5 mm. When the thickness of the metal substrate is less than 0.1 mm or exceeds 1.5 mm, a heat radiation characteristic or thermal conductivity may be excessively increased so that the reliability of the thermoelectric element may be decreased. In addition, when the lower substrate 110 and the upper substrate 160 are metal substrates, an insulating layer 170 may be further formed between the lower substrate 110 and the lower electrodes 120 and between the upper substrate 160 and the upper electrodes 150. The insulating layer 170 may include a material having a thermal conductivity in a range of 1 to 20 W/mK and may correspond to a first insulating layer 220 and a second insulating layer 270 that will be described later. In addition, each insulating layer may be formed of a plurality of layers.

In this case, the lower substrate 110 and the upper substrate 160 may be formed to have different sizes. For example, a volume, a thickness, or an area of one of the lower substrate 110 and the upper substrate 160 may be formed to be greater than that of the other one thereof. Accordingly, heat absorption performance or heat dissipation performance of the thermoelectric element may be improved. Preferably, at least one of the volume, thickness, or area of the lower substrate 110 may be formed to be greater than that of the upper substrate 160. Here, in a case in which the lower substrate 110 is disposed in a high-temperature region for the Seebeck effect, the lower substrate 110 is applied as a heating region for the Peltier effect, or a sealing member for protecting a thermoelectric module, which will be described later, from the external environment is disposed on the lower substrate 110, at least one of the volume, thickness, or area of the lower substrate 110 may be greater than that of the upper substrate 160. Here, the area of the lower substrate 110 may be formed in a range of 1.2 to 5 times the area of the upper substrate 160. When the area of the lower substrate 110 is formed to be less than 1.2 times that of the upper substrate 160, the effect of improving heat transfer efficiency is not great, and when the area of the lower substrate 110 is formed to be more than 5 times that of the upper substrate 160, the heat transfer efficiency is significantly reduced, and the basic shape of the thermoelectric module may be difficult to maintain.

In addition, a heat dissipation pattern, for example, an irregular pattern, may be formed on a surface of at least one of the lower substrate 110 and the upper substrate 160. Accordingly, heat dissipation performance of the thermoelectric element may be improved. When the irregular pattern is formed on a surface in contact with the P-type thermoelectric leg 130 or the N-type thermoelectric leg 140, a bonding property between the thermoelectric leg and the substrate may also be improved. The thermoelectric element 100 includes the lower substrate 110, the lower electrodes 120, the P-type thermoelectric legs 130, the N-type thermoelectric legs 140, the upper electrodes 150, and the upper substrate 160.

As illustrated in FIGS. 3 and 4, a sealing member 190 may be disposed between the lower substrate 110 and the upper substrate 160. The sealing member may be disposed on side surfaces of the lower electrode 120, the P-type thermoelectric leg 130, the N-type thermoelectric leg 140, and the upper electrode 150 between the lower substrate 110 and the upper substrate 160. Accordingly, the lower electrode 120, the P-type thermoelectric leg 130, the N-type thermoelectric leg 140, and the upper electrode 150 may be sealed from external moisture, heat, contamination, and the like. Here, the sealing member 190 may include a sealing case 192 disposed to be spaced apart by a predetermined distance from the outermost side of the plurality of lower electrodes 120, the outermost side of the plurality of P-type thermoelectric legs 130 and the plurality of N-type thermoelectric legs 140, and the outermost side of the plurality of upper electrodes 150, a sealing material 194 disposed between the sealing case 192 and the lower substrate 110, and a sealing material 196 disposed between the sealing case 192 and the upper substrate 160. As described above, the sealing case 192 may be in contact with the lower substrate 110 and the upper substrate 160 through the sealing materials 194 and 196. Accordingly, a problem may be prevented in which thermal conduction occurs through the sealing case 192 when the sealing case 192 is in direct contact with the lower substrate 110 and the upper substrate 160, and as a result, the temperature difference between the lower substrate 110 and the upper substrate 160 is lowered. Here, the sealing materials 194 and 196 may include at least one of an epoxy resin and a silicone resin or may include a tape having both surfaces on which at least one of an epoxy resin and a silicone resin is applied. The sealing materials 194 and 196 may serve to hermetically seal between the sealing case 192 and the lower substrate 110 and between the sealing case 192 and the upper substrate 160, may improve the effect of sealing the lower electrodes 120, the P-type thermoelectric legs 130, the N-type thermoelectric legs 140, and the upper electrodes 150, and may be mixed with a finishing material, a finishing layer, a waterproof material, a waterproof layer, and the like. Here, the sealing material 194 that seals between the sealing case 192 and the lower substrate 110 may be disposed on an upper surface of the lower substrate 110, and the sealing material 196 that seals between the sealing case 192 and the upper substrate 160 may be disposed on side surfaces of the upper substrate 160. To this end, the area of the lower substrate 110 may be greater than the area of the upper substrate 160. Meanwhile, guide grooves G for leading the lead wires 181 and 182 connected to the electrodes may be formed in the sealing case 192. To this end, the sealing case 192 may be an injection molded product made of plastic or the like and may be used with a sealing cover. However, the above description of the sealing member is merely exemplary, and the sealing member may be modified in various forms. Although not illustrated in the drawing, a heat-insulating material may be further included to surround the sealing member. Alternatively, the sealing member may include a heat-insulating component.

Meanwhile, the P-type thermoelectric leg 130 and the N-type thermoelectric leg 140 may have a structure illustrated in FIG. 1A or 1B. Referring to FIG. 1A, the thermoelectric legs 130 and 140 may respectively include thermoelectric material layers 132 and 142, first plated layers 134-1 and 144-1 stacked on one surfaces of the thermoelectric material layers 132 and 142, and the second plated layers 134-2 and 144-2 stacked on the other surfaces of the thermoelectric material layers 132 and 142 which are opposite to the one surfaces. Alternatively, referring to FIG. 1B, the thermoelectric legs 130 and 140 may respectively include thermoelectric material layers 132 and 142, first plated layers 134-1 and 144-1 stacked on one surfaces of the thermoelectric material layers 132 and 142, second plated layers 134-2 and 144-2 stacked on the other surfaces of the thermoelectric material layers 132 and 142, which are opposite to the one surfaces, first buffer layers 136-1 and 146-1 respectively disposed between the thermoelectric material layers 132 and 142 and the first plated layers 134-1 and 144-1, and second buffer layers 136-2 and 146-2 respectively disposed between the thermoelectric material layers 132 and 142 and the second plated layers 134-2 and 144-2. Alternatively, the thermoelectric legs 130 and 140 may further include metal layers stacked between the lower substrate 110 and each of the first plated layers 134-1 and 144-1 and between the upper substrate 160 and each of the second plated layers 134-2 and 144-2.

Here, the thermoelectric material layers 132 and 142 may include Bi and Te which are semiconductor materials. The thermoelectric material layers 132 and 142 may have the same material or shape as the P-type thermoelectric leg 130 or the N-type thermoelectric leg 140 described above. When the thermoelectric material layers 132 and 142 are polycrystalline, the bonding force between the thermoelectric material layers 132 and 142, the first buffer layers 136-1 and 146-1, and the first plated layers 134-1 and 144-1, and the bonding force between the thermoelectric material layers 132 and 142, the second buffer layers 136-2 and 146-2, and the second plated layers 134-2 and 144-2 may be enhanced. Accordingly, even when the thermoelectric element 100 is applied to an application in which vibration occurs, for example, a vehicle or the like, the problem that the first plated layer 134-1 or 144-1 and the second plated layer 134-2 or 144-2 are separated from the P-type thermoelectric leg 130 or the N-type thermoelectric leg 140 and thus carbonized may be prevented, thereby improving the durability and reliability of the thermoelectric element 100.

In addition, the metal layer may be formed of one selected from among Cu, a copper alloy, Al, and an aluminum alloy, and may have a thickness of 0.1 to 0.5 mm, and preferably 0.2 to 0.3 mm.

Next, each of the first plated layers 134-1 and 144-1 and the second plated layers 134-2 and 144-2 may include at least one among Ni, tin (Sn), titanium (Ti), iron (Fe), Sb, chromium (Cr), and molybdenum (Mo) and may have a thickness of 1 to 20 μm, and preferably, 1 to 10 μm. The first plated layers 134-1 and 144-1 and the second plated layers 134-2 and 144-2 prevent a reaction between Bi or Te, which is the semiconductor material of the thermoelectric material layers 132 and 142, and the metal layer so that performance degradation of the thermoelectric element may be prevented, and oxidization of the metal layer may also be prevented.

Here, the first buffer layers 136-1 and 146-1 may be disposed between the thermoelectric material layers 132 and 142 and the first plated layers 134-1 and 144-1, respectively, and the second buffer layers 136-2 and 146-2 may be disposed between the thermoelectric material layers 132 and 142 and the second plated layers 134-2 and 144-2, respectively. In this case, the first buffer layers 136-1 and 146-1 and the second buffer layers 136-2 and 146-2 may each include Te. For example, each of the first buffer layers 136-1 and 146-1 and the second buffer layers 136-2 and 146-2 may include at least one among Ni—Te, Sn—Te, Ti—Te, Fe—Te, Sb—Te, Cr—Te, and Mo—Te. According to the embodiment of the present disclosure, when the first buffer layers 136-1 and 146-1 including Te are disposed between the thermoelectric material layers 132 and 142 and the first plated layers 134-1 and 144-1, respectively, and the second buffer layers 136-2 and 146-2 including Te are disposed between the thermoelectric material layers 132 and 142 and the second plated layers 134-2 and 144-2, respectively, Te in the thermoelectric material layers 132 and 142 may be prevented from diffusing into the first plated layers 134-1 and 144-1 and the second plated layers 134-2 and 144-2. Accordingly, the problem of increasing the electrical resistance in the thermoelectric material layer due to a Bi-rich region may be prevented.

Although the terms the "lower substrate 110," the "lower electrode 120," the "upper electrode 150," and the "upper substrate 160" are used in the above, they are arbitrarily referred to as "upper" and "lower" for ease of understanding and convenience of description, and thus it is understood that the positions may be reversed so that the lower substrate 110 and the lower electrode 120 may be disposed on the upper side and the upper electrode 150 and the upper substrate 160 may be disposed on the lower side.

Figure 5:
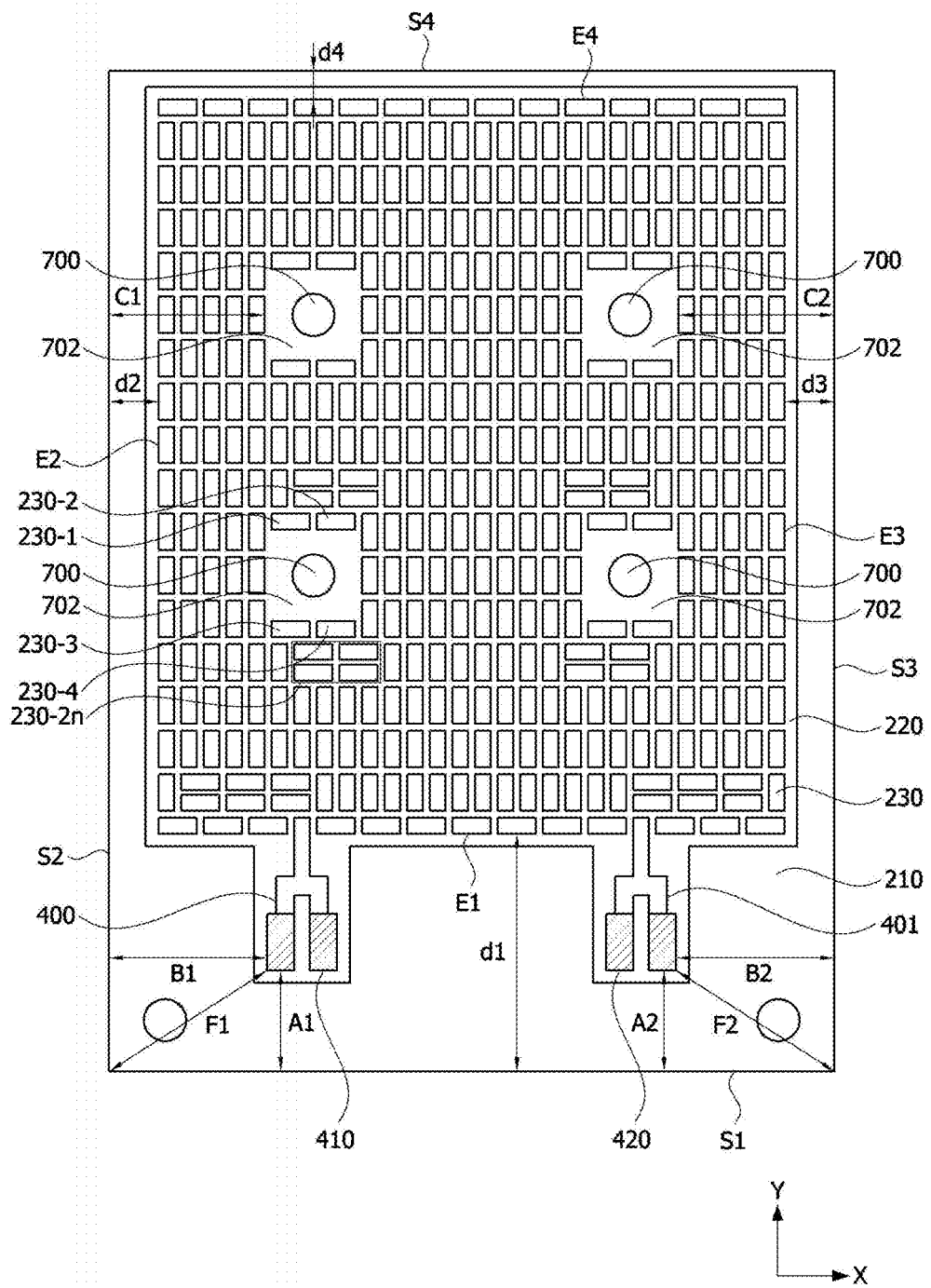
FIG. 5 is a top view of a substrate and electrodes which are included in a thermoelectric element according to one embodiment of the present disclosure.

FIG. 5 is a top view of a substrate, an insulating layer, and electrodes which are included in a thermoelectric element according to one embodiment of the present disclosure, FIG.

Figure 6A:
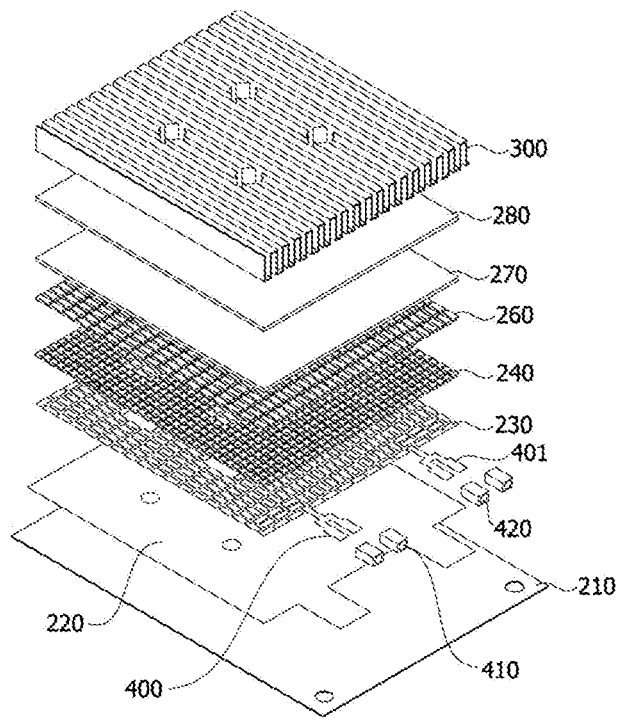
FIGS. 6A and 6B are perspective views of a thermoelectric module in which a heat sink is disposed on the thermoelectric element according to one embodiment of the present disclosure.
Figure 6B:
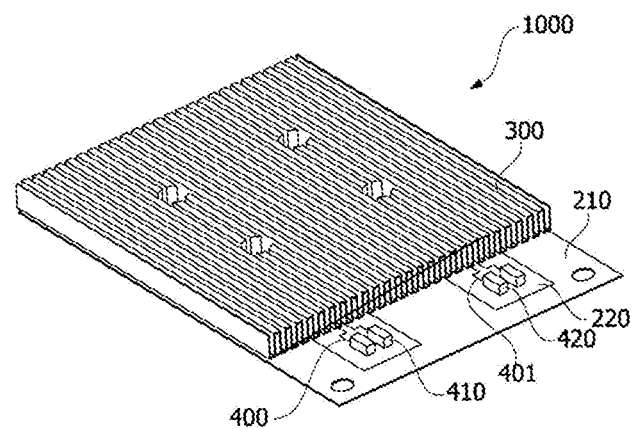
Figure 7:
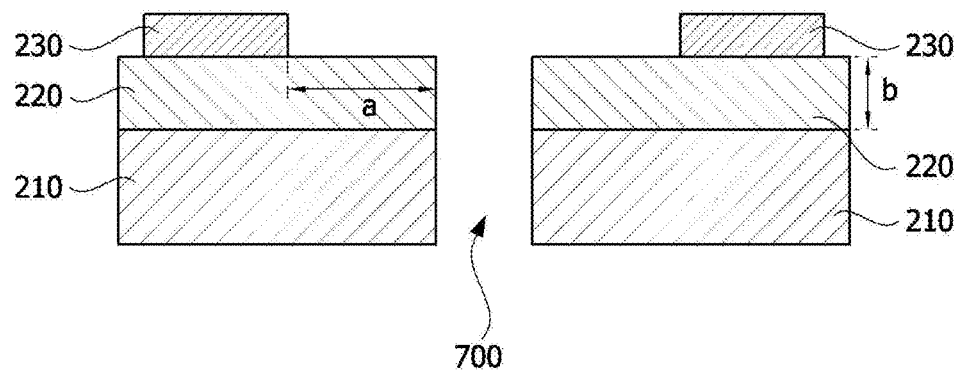
FIGS. 7 and 8 are partial cross-sectional views of the substrate and the electrodes which are included in the thermoelectric element according to one embodiment of the present disclosure.
Figure 8:
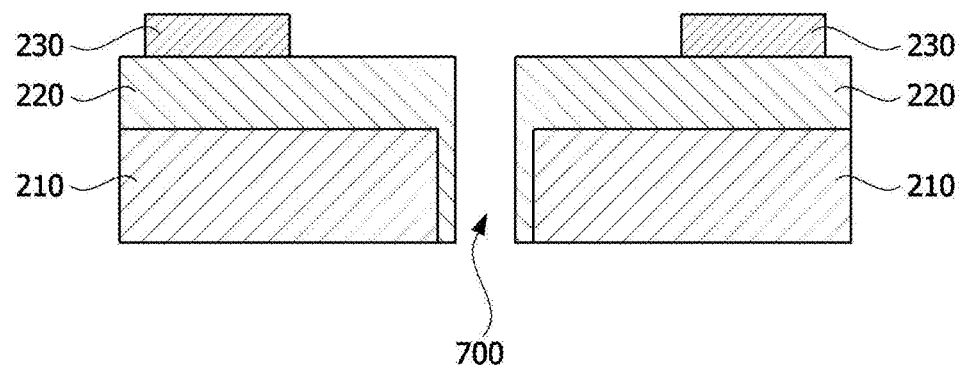
Figure 9:
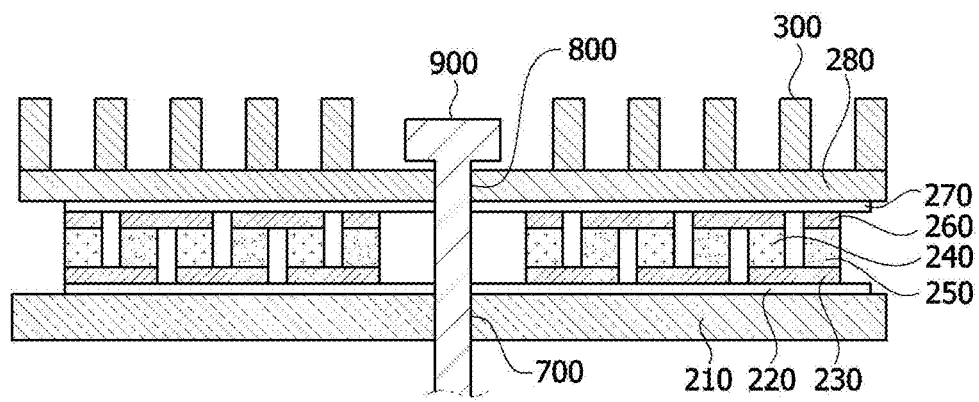
FIGS. 9, 10A, 10B and 10C are cross-sectional views of the thermoelectric module according to one embodiment of the present disclosure.

6A is an exploded perspective view of a thermoelectric module in which a heat sink is disposed on the thermoelectric element according to one embodiment of the present disclosure, and FIG. 6B is a perspective view of the thermoelectric module in which the heat sink is disposed on the thermoelectric element according to one embodiment of the present disclosure. FIGS. 7 and 8 are partial cross-sectional views of the substrate, the insulating layer, and the electrodes which are included in the thermoelectric element according to one embodiment of the present disclosure, and FIGS. 9, 10A, 10B and 10C are cross-sectional views of the thermoelectric module according to one embodiment of the present disclosure. FIG. 11 is a layout view in which a plurality of thermoelectric elements according to the embodiment of the present disclosure are connected. Repetitive descriptions of contents which are the same as those described above with reference to FIGS. 1 to 4 will be omitted.

Referring to FIGS. 5 to 10, a thermoelectric module 1000 according to the embodiment of the present disclosure includes a thermoelectric element 200 and a heat sink 300 disposed on the thermoelectric element 200.

The thermoelectric element 200 includes a first substrate 210, a first insulating layer 220 disposed on the first substrate 210, a plurality of first electrodes 230 disposed on the first insulating layer 220, a plurality of P-type thermoelectric legs 240 and a plurality of N-type thermoelectric legs 250 disposed on the plurality of first electrodes 230, a plurality of second electrodes 260 disposed on the plurality of P-type thermoelectric legs 240 and the plurality of N-type thermoelectric legs 250, a second insulating layer 270 disposed on the plurality of second electrodes 260, and a second substrate 280 disposed on the second insulating layer 270. Although not illustrated in the drawing, a sealing member may be further disposed between the first substrate 210 and the second substrate 280 to surround the first insulating layer 220, the plurality of first electrodes 230, the plurality of P-type thermoelectric legs 240 and the plurality of N-type thermoelectric legs 250, the plurality of second electrodes 260, and the second insulating layer 270.

Here, the first electrode 230, the P-type thermoelectric leg 240, the N-type thermoelectric leg 250, and the second electrode 260 may respectively correspond to the lower electrode 120, the P-type thermoelectric leg 130, the N-type thermoelectric leg 140, and the upper electrode 150 described with reference to FIGS. 1A, 1B and 2, and the contents described with reference to FIGS. 1A, 1B and 2 may be applied in the same or a similar manner.

Here, at least one of the first substrate 210 and the second substrate 280 may be a metal substrate. For example, at least one of the first substrate 210 and the second substrate 280 may be made of at least one among aluminum, an aluminum alloy, copper, and a copper alloy. The first substrate 210 and the second substrate 280 may be made of different materials. For example, among the first substrate 210 and the second substrate 280, the substrate requiring a higher withstand voltage performance may be formed of an aluminum substrate, and the substrate requiring a higher thermal conduction performance may be formed of a copper substrate.

Although not illustrated in the drawing, a solder layer may be disposed between the plurality of first electrodes 230, and the plurality of P-type thermoelectric legs 240 and the plurality of N-type thermoelectric legs 250 to bond the plurality of first electrodes 230 to the plurality of P-type thermoelectric legs 240 and the plurality of N-type thermoelectric legs 250. In addition, a solder layer may be disposed between the plurality of second electrodes 260, and the plurality of P-type thermoelectric legs 240 and the plurality of N-type thermoelectric legs 250 to bond the plurality of second electrodes 260 to the plurality of P-type thermoelectric legs 240 and the plurality of N-type thermoelectric legs 250. In addition, a solder layer may be disposed between the second substrate 280 and the heat sink 300 to bond the second substrate 280 to the heat sink 300.

In the present specification, the term "withstand voltage performance" may mean a characteristic that is maintained without insulation breakdown for a predetermined period of time under a predetermined voltage and a predetermined current. For example, when a characteristic is maintained for 10 seconds without insulation breakdown under an alternating current (AC) voltage of 2.5 kV and a current of 1 mA, a withstand voltage may be 2.5 kV.

Meanwhile, power is generally connected to the electrode disposed at a cold side of the thermoelectric element 200, and thus higher withstand voltage performance may be required on the cold side compared to a hot side. In contrast, when the thermoelectric element 200 is driven, the hot side of the thermoelectric element 200 may be exposed to a high temperature, for example, greater than or equal to about 180° C., and delamination between the electrode, the insulating layer, and the substrate occurring due to different thermal expansion coefficients between the electrode, the insulating layer, and the substrate may become a problem. Accordingly, higher thermal shock mitigation performance may be required on the hot side of the thermoelectric element 200 compared to the cold side thereof. Accordingly, the structure of the hot side may be different from the structure of the cold side.

Hereinafter, a case in which a terminal electrode 400 is connected to the first electrode 230 disposed on the first substrate 210 will be mainly described.

As described above, the first insulating layer 220 is disposed on the first substrate 210, and the plurality of first electrodes 230 are disposed on the first insulating layer 220.

Here, the plurality of first electrodes 230 may be arranged to form a plurality of electrode outer peripheries, and the first substrate 210 may have a plurality of substrate outer peripheries corresponding to the plurality of electrode outer peripheries. Here, the electrode outer peripheries may mean edges of the plurality of first electrodes 230, and the substrate outer peripheries may mean edges of the first substrate 210. For example, when the plurality of first electrodes 230 are arranged in a rectangular shape, the plurality of first electrodes 230 may have first to fourth electrode outer peripheries E1 to E4, and the first substrate 210 may have first to fourth substrate outer peripheries S1 to S4 respectively corresponding to the first to fourth electrode outer peripheries E1 to E4.

According to the embodiment of the present disclosure, the terminal electrode is an electrode to which an electric wire is connected and may be disposed on the first insulating layer 220 to be coplanar with the plurality of first electrodes 230. Thus, the terminal electrode may be expressed as a component included in the plurality of first electrodes 230, that is, as one of the plurality of first electrodes 230. Alternatively, the terminal electrode may be expressed as a component disposed between the plurality of first electrodes 230 to be directly or indirectly connected to at least one of the plurality of first electrodes 230.

The terminal electrode may be divided into a first terminal electrode 400 and a second terminal electrode 401, and the terminal electrodes 400 and 401 may each include an extension portion extending toward one of the first to fourth substrate outer peripheries S1 to S4 from an effective region so that the terminal electrodes 400 and 401 are electrically connected to a first connection unit 410 and a second connection unit 420, respectively. Here, the extension portion may refer to a region which is included in each of the terminal electrodes 400 and 401 and in which the first connection unit 410 or the second connection unit 420 is disposed. Alternatively, the extension portion may refer to the terminal electrode 400 or 401 itself, and thus the extension portion may be used with the terminal electrode 400 or 401. In this case, the extension portion of each of the first terminal electrode 400 and the second terminal electrode 401 may extend by branching singularly or plurally depending on the connection type such as a serial connection, a parallel connection or a serial-parallel connection with adjacent devices. In the present specification, the term "effective region" may be defined as a region in which the plurality of first electrodes and the plurality of second electrodes vertically overlap each other, that is, a region in which the plurality of P-type thermoelectric legs 240 and the plurality of N-type thermoelectric legs 250 are disposed so that the Peltier effect or the Seebeck effect is substantially realized. The first connection unit 410 and the second connection unit 420 may be disposed on the extension portions of the first terminal electrode 400 and the second terminal electrode 401, respectively, and each of the connection units 410 and 420 may be a connector device that electrically connects the terminal electrodes 400 and 401 to external terminals. For example, at least one negative (−) terminal may be connected to the first connection unit 410 at the extension portion of the first terminal electrode 400, and at least one positive (+) terminal may be connected to the second connection unit 420 at the extension portion of the second terminal electrode 401, but the number of the extension portions of the terminal electrodes 400 and 401 and the connection units 410 and 420, the arrangement form, and the polarities of the external terminals are not limited thereto.

Each of the first terminal electrode 400 and the second terminal electrode 401 may be electrically connected directly or indirectly to one of the plurality of first electrodes 230 or the plurality of second electrodes 260. When each of the first terminal electrode 400 and the second terminal electrode 401 is indirectly connected to one of the plurality of first electrodes 230 or the plurality of second electrodes 260, at least one of the plurality of P-type thermoelectric legs 240 and the plurality of N-type thermoelectric legs 250 may be disposed on each of the first terminal electrode 400 and the second terminal electrode 401. Accordingly, a position of the terminal electrode 400 may affect an insulation resistance of the thermoelectric element 200. The term "insulation resistance" refers to an electrical resistance that appears on an insulator when a predetermined voltage is applied, and a predetermined insulation resistance must be satisfied in a case in which the thermoelectric element 200 is exposed to a high-voltage environment or a plurality of thermoelectric elements 200 are connected and driven. For example, when a direct current (DC) voltage of 500 V is applied to the thermoelectric element 200, the thermoelectric element 200 must satisfy the requirement of having an insulation resistance of 500 MΩ or more.

According to the embodiment of the present disclosure, insulation resistance is intended to be improved using the position of the terminal electrode 400.

According to the embodiment of the present disclosure, when the terminal electrode 400 is connected to some of the plurality of first electrodes 230 disposed on the first electrode outer periphery E1 or is disposed between the plurality of first electrodes 230 disposed on the first electrode outer periphery E1, a distance d1 between the first electrode outer periphery E1 and the first substrate outer periphery S1 may be greater than distances d2 to d4 respectively between second to fourth electrode outer peripheries E2 to E4 and second to fourth substrate outer peripheries S2 to S4. Here, the terminal electrode 400 may be lead out of the sealing member (not shown) disposed between the first substrate 210 and the second substrate 280 to surround the first insulating layer 220, the plurality of first electrodes 230, the plurality of P-type thermoelectric legs 240 and the plurality of N-type thermoelectric legs 250, the plurality of second electrodes 260, and the second insulating layer 270.

Here, a shortest distance A1 between the first terminal electrode 400 and the first substrate outer periphery S1 may be greater than or equal to 12 mm, preferably greater than or equal to 14 mm, and more preferably greater than or equal to 16 mm.

In addition, a shortest distance B1 between the second substrate outer periphery S2, which is connected to the first substrate outer periphery S1, and the first terminal electrode 400 and a shortest distance B2 between the third substrate outer periphery S3, which is connected to the first substrate outer periphery S1, and the second terminal electrode 401 may each be greater than or equal to 12 mm, preferably greater than or equal to 14 mm, and more preferably greater than or equal to 16 mm.

Alternatively, a shortest distance F1 between the first terminal electrode 400 and a point at which the first substrate outer periphery S1 meets the second substrate outer periphery S2, that is, a vertex between the first and second substrate outer peripheries S1 and S2, and a shortest distance F2 between the second terminal electrode 401 and a point at which the first substrate outer periphery S1 meets the third substrate outer periphery S3, that is, a vertex between the first and third substrate outer peripheries S1 and S3, may each be greater than or equal to 12 mm, preferably greater than or equal to 14 mm, and more preferably greater than or equal to 16 mm.

As described above, when the distance between the terminal electrode 400 and each of the substrate outer peripheries is adjusted, the thermoelectric element having an insulation resistance of 500 MΩ or more under a DC voltage of 500 V may be obtained.

In more detail, ratios of the distance d1 between the first electrode outer periphery E1 and the first substrate outer periphery S1 to the distances A1, B1, F1, A2, B2, and F2 between the substrate outer peripheries and the terminal electrodes 400 and 401 may be in a range of 1.2 to 2.5. That is, the shortest distance d1 between the effective region and the first substrate outer periphery S1 may be 1.2 to 2.5 times the shortest distances A1 and A2 respectively between ends of the terminal electrodes 400 and 401 and the first substrate outer periphery S1. Here, the effective region may mean a region in which the plurality of first electrodes 230 and the plurality of second electrodes 260 vertically overlap each other. For example, when each of the shortest distances A1 and A2 respectively between the terminal electrodes 400 and 401 and the first substrate outer periphery S1 is 12 mm, the distance d1 between the first electrode outer periphery E1 and the first substrate outer periphery S1 may be in a range of 14.5 to 30 mm. When the ratio of the distance d1 between the first electrode outer periphery E1 and the first substrate outer periphery S1 to the distances A1, B1, F1, A2, B2, and F2 between the substrate outer peripheries and the terminal electrodes 400 and 401 is less than 1.2, sparks may occur due to a short circuit between one of the first connection unit 410 and the second connection unit 420, which are respectively disposed on the terminal electrodes 400 and 401, and the plurality of first electrodes 230 disposed along the first electrode outer periphery E1. On the other hand, when the ratio of the distance d1 between the first electrode outer periphery E1 and the first substrate outer periphery S1 to the distances A1, B1, F1, A2, B2, and F2 between the substrate outer peripheries and the terminal electrodes 400 and 401 is greater than 2.5, the area of the effective region, that is, the region in which the thermoelectric legs can be disposed, is substantially reduced, and thus in a case in which the thermoelectric module is a power generation module using the Seebeck effect, the amount of power generation may be reduced.

Here, each of the first connection unit 410 and the second connection unit 420 may be a connector into which an electric wire is inserted in a detachable manner. As described above, a portion of the terminal electrode 400 and each of the first connection unit 410 and the second connection unit 420 may be disposed outside the sealing member. Accordingly, the electric-wire connection may be simple, and the possibility of disconnection between the electrode and the electric wire may be minimized.

Further, each of the first connection unit 410 and the second connection unit 420 may be sealed with a resin including silicon. Accordingly, the insulation resistance and the withstand voltage performance of the thermoelectric element may be further enhanced.

Meanwhile, referring to FIGS. 5 and 7, at least one first through-hole 700 may be formed to pass through the first substrate 210 and the first insulating layer 220. Here, the first through-hole 700 may be a coupling hole through which a coupling member 900 passes as illustrated in FIGS. 9, 10A, 10B and 10C. The coupling member 900 may be connected from the heat sink 300 to the first substrate 210. Although not illustrated in the drawing, when the thermoelectric element is a power generation device using the Seebeck effect, the coupling member 900 may be connected from the heat sink 300 to a first fluid flow part (not shown) disposed below the first substrate 210. In another embodiment, the first substrate 210 and the first fluid flow part (not shown) may be connected to each other through a different coupling member at an outside of the effective region on the first substrate 210. The first fluid flow part may have a flow path formed therein to allow a first fluid to flow, and in some cases, the first fluid flow part may be omitted, and the first fluid may flow directly to the first substrate 210. Specifically, the first fluid may flow adjacent to the first substrate 210, and a second fluid may flow adjacent to the second substrate 280 and the heat sink 300. In this case, the heat sink 300 may be a second fluid flow part in which a flow path is formed to allow the second fluid to flow. Here, a temperature of the second fluid may be higher than a temperature of the first fluid. As another example, the temperature of the first fluid may be higher than the temperature of the second fluid, and in this case, the heat sink 300 may be omitted or connected to the first substrate 210. An absolute value of the temperature difference between the second fluid and the first fluid may be greater than or equal to 40° C., preferably greater than or equal to 70° C., and more preferably in a range of 95° C. to 185° C.

Here, a shortest distance a between the plurality of first electrodes 230 and an edge of the first through-hole 700 may be greater than or equal to 8 mm, preferably in a range of 8 mm to 12 mm, more preferably in a range of 8 mm to 10 mm, and even more preferably in a range of 8 mm to 9 mm. Here, the shortest distance a between the plurality of first electrodes 230 and the edge of the first through-hole 700 may be 50 times or more a thickness b of the first insulating layer 220, and preferably 50 to 180 times the thickness b of the first insulating layer 220. Accordingly, even when a spark occurs at the electrode under a high voltage, a sufficient insulation distance may be secured to the extent that the substrate is not affected so that the thermoelectric element with high withstand voltage performance may be obtained. In particular, when the shortest distance a between the plurality of first electrodes 230 and the edge of the first through-hole 700 is less than 50 times the thickness b of the first insulating layer 220, heat transfer characteristics are degraded due to the increase in a thermal resistance of the first insulating layer 220, and accordingly, the amount of power generation may be reduced. In contrast, when the shortest distance a between the plurality of first electrodes 230 and the edge of the first through-hole 700 is more than 180 times the thickness b of the first insulating layer 220, the thermal resistance of the first insulating layer 220 is decreased to improve the heat transfer characteristics, but the area in which the thermoelectric legs can be disposed is reduced, and the possibility that the first insulating layer 220 may be delaminated at a high temperature is increased.

Meanwhile, a ratio of the shortest distance a between the edge of the first through-hole 700 and the plurality of first electrodes 230 to the thickness b of the first insulating layer 220 may vary depending on the type of the first insulating layer 220, and the first insulating layer 220 may be formed of one or more layers. For example, the first insulating layer 220 may be a layer formed of at least one of a resin layer including a resin and an inorganic material and a layer made of the inorganic material alone. The inorganic material may include at least one of an oxide, a carbide, and a nitride including aluminum, titanium, zirconium, boron, zinc, and the like, and in the case of aluminum oxide, which is an oxide of aluminum, withstand voltage characteristics may be dependent on the content of the aluminum oxide. For example, under the condition in which the shortest distance a between the plurality of first electrodes 230 and the edge of the first through-hole 700 is the same, in a case in which the first insulating layer 220 is a resin layer having a relatively great amount of aluminum oxide, withstand voltage of the same performance may be obtained even with a smaller thickness compared to a case in which the first insulating layer 220 is a resin layer having a relatively small amount of aluminum oxide. In addition, under the condition in which the shortest distance a between the plurality of first electrodes 230 and the edge of the first through-hole 700 is the same, in a case in which the first insulating layer 220 is a layer made of an inorganic material alone including aluminum oxide, withstand voltage of the same performance may be obtained even with a smaller thickness compared to a case in which the first insulating layer 220 is a resin layer.

Here, a plurality of first through-holes 700 may be formed in the first substrate 210, and accordingly, a plurality of hole arrangement regions 702 may also be formed on the first substrate 210. For example, the first substrate 210 may include four first through-holes 700 and four hole arrangement regions 702. Here, the hole arrangement region 702 may be defined as a space formed by virtual lines connecting surfaces of the electrodes which are closest to the first through-hole 700 and are disposed adjacent to each other. The hole arrangement region 702 may be formed to have a polygonal shape and, preferably, may be formed to have a quadrangular shape. In this case, the plurality of first electrodes 230 may not be disposed in the hole arrangement region 702.

Here, among the plurality of first electrodes 230, two first electrodes 230-1 and 230-2, which are adjacent to the hole arrangement regions 702, may be disposed so that length directions thereof are directed in a second direction X, and the other two first electrodes 230-3 and 230-4, which are adjacent to the hole arrangement regions 702, may also be disposed so that length directions thereof are directed in the second direction X. Accordingly, a multiple of two of the plurality of first electrodes 230 may be disposed to face the second direction X. In more detail, at least 16 first electrodes 230-1 to 230-4 among the plurality of first electrodes 230 may be disposed to face the second direction X. In addition, the remaining first electrodes 230 may be disposed so that length directions thereof are directed in a first direction Y.

Further, $2n$ first electrodes 230-$2n$ (wherein n is an integer of one or more), which are adjacent to at least one of four first electrodes 230-1 to 230-4 disposed adjacent to any one of the hole arrangement regions 702 so as to face the second direction X, may also be disposed so that length directions thereof are directed in the second direction X. Here, a position at which the $2n$ first electrodes 230-$2n$ are disposed may be variously changed according to an arrangement structure of the plurality of second electrodes 260.

In addition, a plurality of electrodes may be disposed between the hole arrangement region 702 and the $2n$ first electrodes 230-$2n$. In addition, the $2n$ first electrodes 230-$2n$ may be disposed in the second direction X so that at least some thereof overlap a virtual space formed by extension lines extending from virtual lines that define the hole arrangement region 702.

Here, the extension portion of the terminal electrode may also be disposed so that at least a portion thereof overlaps the virtual space formed by the extension lines extending from the virtual lines that define the hole arrangement region 702.

In FIG. 5, the $2n$ first electrodes 230-$2n$ are illustrated as being disposed in the second direction X, but the present disclosure is not limited thereto, and the $2n$ second electrodes may be disposed in the first direction Y.

Two rows disposed in the second direction X so as to be opposite to each other in edge regions may be included in the first electrodes 230 disposed on the first substrate 210 or may be included in the second electrodes 260 disposed on the second substrate 280.

Meanwhile, an area of the hole arrangement region 702 may be four times or more, preferably six times or more, and more preferably eight times or more an area of one first electrode 230. When the area of the hole arrangement region 702 is less than four times the area of one first electrode 230, under a high voltage of AC 1 kV or more, a current may flow to the first substrate 210 through the first through-hole 700 to cause electrical breakdown of the thermoelectric module. Thus, in an application field under a high voltage, it is important to secure a sufficient insulation distance to prevent the electrical breakdown of the thermoelectric module. In a case in which the area of the hole arrangement region 702 is eight times or more the area of one first electrode 230, the electrical breakdown does not occur even under a high voltage of AC 2.5 kV or more.

In addition, all the electrodes disposed closest to a first edge (not shown in the drawing) of the first substrate 210 among the plurality of first electrodes 230 may be periodically disposed and may be disposed so that a path between a starting point and an ending point of a virtual line, which connects surfaces of the electrodes disposed closest to the first edge of the first substrate 210, is a straight line without a bent region. That is, it may mean that, among four surfaces of all the first electrodes 230 closest to the first edge of the first substrate 210, surfaces of the electrodes disposed closest to the first edge of the first substrate 210 are disposed in one direction to be spaced apart from the first edge of the first substrate 210 by the same distance without a removed region. For example, when a path between a starting point and an ending point of a virtual line connecting the surfaces of the electrodes disposed closest to the first edge of the first substrate 210 is a straight line, it may mean that all the electrodes on a first column (not shown in the drawing) among the plurality of first electrodes 230 are periodically disposed. Accordingly, when the plurality of first electrodes 230 are disposed on the first substrate 210, the complexity of a process may be reduced, and the arrangement structure of the second electrodes 260 disposed on the second substrate 280 and the thermoelectric legs disposed between the first electrodes 230 and the second electrodes 260 may be simplified. In addition, since the shortest distance between the edge of the first substrate 210 and the first electrodes 230 disposed closest to the edge of the first substrate 210 is constantly maintained, the first electrodes 230 disposed closest to the edge of the first substrate 210 may have uniform electrical characteristics.

If the path between the starting point and the ending point of the virtual line connecting the surfaces of the electrodes disposed closest to the first edge of the first substrate 210 includes a bent region, it may mean that a region in which some of the electrodes in the first column among the plurality of first electrodes 230 are removed or recessed is included and thus the periodicity of a batch is lost. The surfaces of the electrodes, which are disposed closest to the first edge of the first substrate 210, in the bent region may be surfaces of the electrodes disposed in a second column (not shown in the drawing) that is the subsequent column to the first column. Here, the second column may be a column disposed farther from the first edge of the first substrate 210 than the first column and may not be the outermost column. The first electrodes 230 may be disposed to include a bent region, but in this case, as described above, in the application field under a high voltage, a sufficient insulation distance may not be secured to cause an electrical breakdown of the thermoelectric module, or an effective region of the first electrode part may be reduced, resulting in degradation in the efficiency of the thermoelectric module.

Likewise, among the plurality of first electrodes 230, the electrodes (Nth column) closest to a second edge (not shown in the drawing) that is opposite to the first edge of the first substrate 210, the electrodes (first row) closest to a third edge (not shown in the drawing) between the first edge and the second edge of the first substrate 210, and the electrodes (Mth row) closest to a fourth edge (not shown in the drawing) opposite to the third edge of the first substrate 210 may all be disposed so that a path between a starting point and an ending point of a virtual line connecting surfaces of the electrodes closest to each of the above-described edges of the first substrate 210 is a straight line without a bent region, but depending on the design such as the arrangement of the terminal electrodes, only one among the outermost columns or the outermost rows, for example, any one among the first column, the Nth column, the first row, and the Mth row may have an exceptional path. For example, the terminal electrode may be connected to the plurality of first electrodes 230 disposed in any one of the first column, the Nth column, the first row, and the Mth row, which is the outermost column or the outermost row, may be disposed between the plurality of first electrodes 230 disposed in any one of the first column, the Nth column, the first row, and the Mth row or may extend from the first electrode 230 disposed in any one of the first column, the Nth column, the first row, and the Mth row. Accordingly, among the outermost rows and the outermost rows, the remaining rows or columns, except for one row or column in which the terminal electrode is disposed, may be disposed to be spaced apart from the corresponding edge of the first substrate 210 at regular intervals.

Meanwhile, referring to FIG. 8, the first insulating layer 220 may be further disposed on at least a portion of a wall surface of the first through-hole 700 formed in the first substrate 210. Accordingly, the withstand voltage performance of the thermoelectric element may be further enhanced.

Meanwhile, referring to FIGS. 6A, 6B, 9, 10A, 10B and 10C at least one second through-hole 800 may be formed to pass through the heat sink 300, the second substrate 280, and the second insulating layer 270, and at least one coupling member 900 may pass through at least one second through-hole 800 formed in the heat sink 300, the second substrate 280, and the second insulating layer 270 and the at least one first through-hole 700 formed in the first substrate 210 and the first insulating layer 220.

Figure 10A:
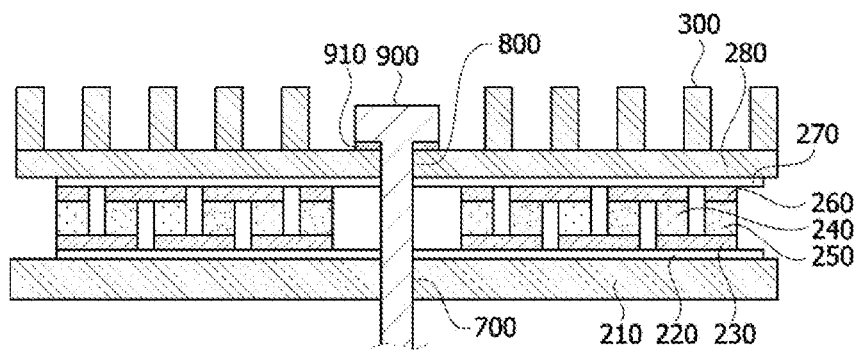
Figure 10B:
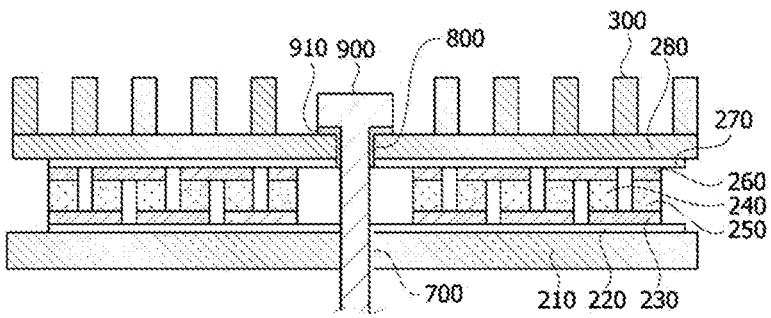
Figure 10C:
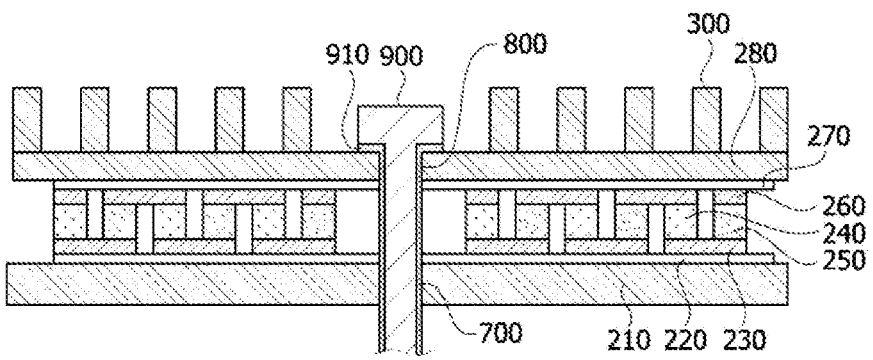
Figure 11:
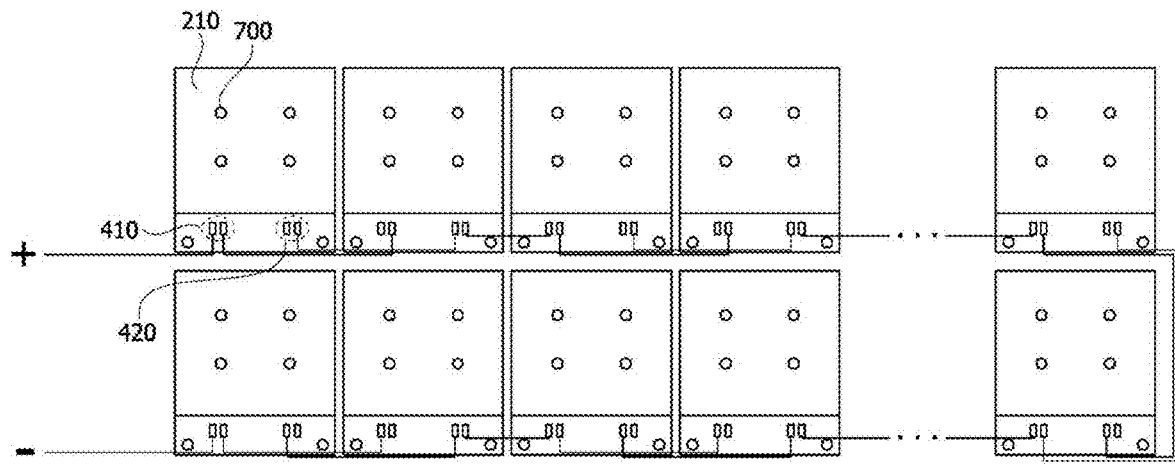
FIG. 11 is a layout view in which a plurality of thermoelectric elements according to the embodiment of the present disclosure are connected.

Here, as illustrated in FIGS. 10A to 10C, at least one insulating insertion member 910 may be further disposed on at least a portion of an upper surface of the second substrate 280, which is adjacent to the second through-hole 800, or on at least a portion of an outer circumferential surface of the coupling member 900, and thus the insulation distance may be further secured so that the withstand voltage performance of the thermoelectric element may be further enhanced. Preferably, when a shortest distance between an edge of the second through-hole 800 and the second electrode is also greater than or equal to 8 mm, it may be effective in withstand voltage performance. Referring to FIGS. 10B and 10C, the insulating insertion member 910 may be disposed between the second through-hole 800 and the coupling member 900. Referring to FIG. 10B, when the insulating insertion member 910 is disposed only in the second through-hole 800, a diameter of the second through-hole 800 may be greater than a diameter of the first through-hole 700 by as much as a width of the insulating insertion member 910. In this case, although the shortest distance between the edge of the second through-hole 800 and the second electrode may be relatively reduced, since the insulating insertion member 910 is disposed in the second through-hole 800 by as much as the reduced width, the insulation effect is not degraded, and as a result, the withstand voltage performance is not affected. Here, the diameter of the second through-hole may be 1.1 to 2.0 times the diameter of the first through-hole. Although not illustrated in the drawing, a solder layer may be disposed in at least one of a space between the plurality of first electrodes 230, and the plurality of P-type thermoelectric legs 240 and the plurality of N-type thermoelectric legs 250, a space between the plurality of second electrodes 260, and the plurality of P-type thermoelectric legs 240 and the plurality of N-type thermoelectric legs 250, and a space between the second substrate 280 and the heat sink 300.

Meanwhile, according to the embodiment of the present disclosure, the first through-hole 700 may be formed to correspond to a region in which the terminal electrode is disposed. That is, a shortest distance C1 between the second substrate outer periphery S2 and the edge of the first through-hole 700 may be within ±10% of the shortest distance B1 between the second substrate outer periphery S2 and the first terminal electrode 400. That is, the shortest distance C1 between the second substrate outer periphery S2 and the edge of the first through-hole 700 may be 0.9 to 1.1 times the shortest distance B1 between the second substrate outer periphery S2 and the first terminal electrode 400. Likewise, a shortest distance C2 between the third substrate outer periphery S3 and the edge of the first through-hole 700 may be within ±10% of the shortest distance B2 between the third substrate outer periphery S3 and the second terminal electrode 401. That is, the shortest distance C2 between the third substrate outer periphery S3 and the edge of the first through-hole 700 may be 0.9 to 1.1 times the shortest distance B2 between the third substrate outer periphery S3 and the second terminal electrode 401. As described above, in order to increase the insulation resistance, the distance between the terminal electrode 400 and each of the second substrate outer periphery S2 and the third substrate outer periphery S3 should satisfy a predetermined distance or more. When the first through-hole 700 is formed to correspond to the position of the terminal electrode 400, insulation may be secured, and the thermoelectric element 200 may be stably coupled to the heat sink 300, and the plurality of first electrodes 230 may be easily disposed.

Here, each of the first connection unit 410 and the second connection unit 420 may be connected to two terminals having the same polarity. That is, two negative (−) terminals, which are connected to one of the plurality of first electrodes 230 and branched, may be connected to the first connection unit 410, and two positive (+) terminals, which are connected to another one of the plurality of first electrodes 230 and branched, may be connected to the second connection unit 420. Accordingly, as illustrated in FIG. 11, the plurality of thermoelectric elements may be connected to each other in a serial-parallel manner, and thus high power conversion efficiency may be obtained with a minimum area.

As described above, according to the embodiment of the present disclosure, the first insulating layer 220 may be a layer formed of at least one of a resin layer including a resin and an inorganic material and a layer made of an inorganic material alone. Here, the inorganic material may include aluminum or aluminum oxide.

For example, the first insulating layer 220 may include a composite including silicon and aluminum. Here, the composite may be at least one among an oxide, a carbide, and a nitride including silicon and aluminum. For example, the composite may include at least one among an Al—Si bond, an Al—O—Si bond, a Si—O bond, an Al—Si—O bond, and an Al—O bond. The composite, which includes at least one among the Al—Si bond, the Al—O—Si bond, the Si—O bond, the Al—Si—O bond, and the Al—O bond as described above, has an excellent insulating performance and thus may achieve high withstand voltage performance. Alternatively, the composite may be an oxide, a carbide, or a nitride further including titanium, zirconium, boron, zinc, and the like together with silicon and aluminum. To this end, the composite may be obtained through a process of mixing aluminum with at least one of an inorganic binder and an organic-inorganic hybrid binder and then heat-treating. The inorganic binder may include at least one among, for example, silica ($SiO_2$), metal alkoxide, boron oxide ($B_2O_3$), and zinc oxide ($ZnO_x$). The inorganic binder may be inorganic particles and may act as a binder by being solated or gelled when coming into contact with water. In this case, at least one of the silica ($SiO_2$), the metal alkoxide, and the boron oxide ($B_2O_3$) may serve to increase the adhesion between aluminum, or the adhesion to the first substrate 210, and the zinc oxide ($ZnO_x$) may serve to increase the strength of the first insulating layer 220 and increase the thermal conductivity.

Here, the composite may be included in an amount of greater than or equal to 80 wt %, preferably in an amount of greater than or equal to 85 wt %, and more preferably in an amount of greater than or equal to 90 wt % of the entire first insulating layer 220.

The first insulating layer 220 may be formed on the first substrate 210 through a wet process. Here, the wet process may be a spray coating process, a dip coating process, a screen printing process, or the like. Accordingly, the thickness of the first insulating layer 220 may be easily controlled, and composites of various compositions may be applied.

Alternatively, the first insulating layer 220 may be formed as a resin layer which includes at least one selected from among an epoxy resin composition including an epoxy resin and an inorganic material and a silicone resin composition including polydimethylsiloxane (PDMS).

Here, the inorganic material may be included in an amount of 60 to 90 wt % of the resin layer. When the inorganic material is included at less than 60 wt %, a thermal conduction effect may be reduced, and when the inorganic material is included at more than 90 wt %, the inorganic material may be difficult to uniformly disperse in the resin and the resin layer may be easily broken.

In addition, the epoxy resin may include an epoxy compound and a curing agent. In this case, the curing agent may be included in a volume ratio of 1 to 10 with respect to a volume ratio of 10 of the epoxy compound. Here, the epoxy compound may include at least one among a crystalline epoxy compound, an amorphous epoxy compound, and a silicone epoxy compound. The inorganic material may include aluminum oxide and may further include at least one of boron nitride and aluminum nitride.

In this case, a particle size D50 of the boron nitride agglomerate may be in a range of 250 to 350 μm, and a particle size D50 of the aluminum oxide may be in a range of 10 to 30 μm. When the particle size D50 of the boron nitride aggregate and the particle size D50 of the aluminum oxide satisfy the above numerical range, the boron nitride aggregate and the aluminum oxide may be uniformly dispersed in the resin layer, and accordingly, the entire resin layer may have uniform thermal conduction effect and bonding performance.

Alternatively, the first insulating layer 220 may include both the composite including silicon and aluminum, and the resin layer including at least one of an epoxy resin composition containing an epoxy resin and an inorganic material and a silicone resin composition containing PDMS. For example, the composite including silicon and aluminum and the resin layer may be sequentially stacked or alternately stacked.

Alternatively, the first insulating layer 220 may be an aluminum oxide layer. When the first substrate 210 is an aluminum substrate, the first insulating layer 220 may be formed through a method of surface oxidizing the first substrate 210, but the present disclosure is not limited thereto.

Figure 12:
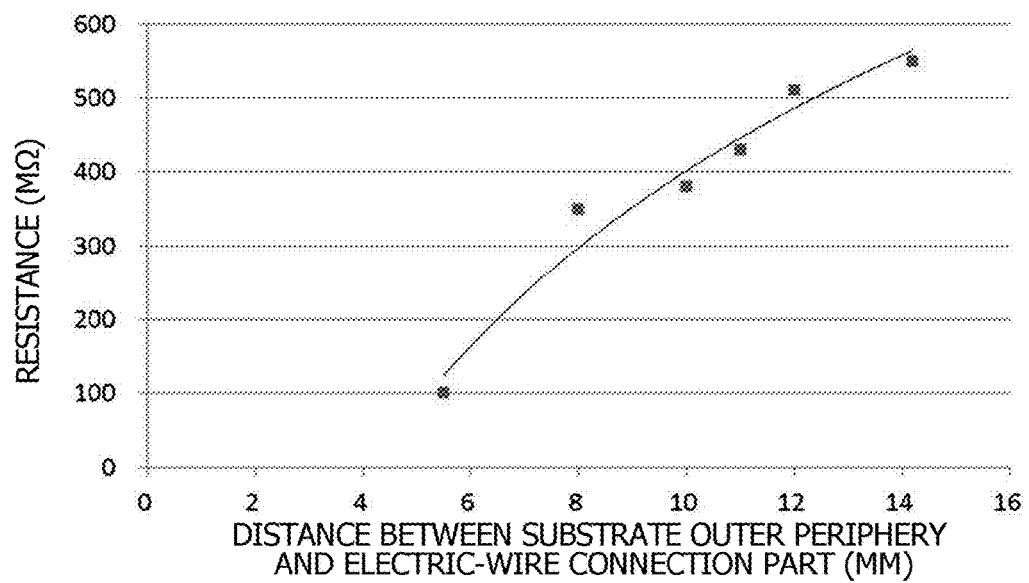
FIG. 12 is a graph illustrating a result of measuring an insulation resistance according to a distance between a substrate outer periphery and an electric-wire connection part.

Table 1 and FIG. 12 illustrate a result of measuring a resistance according to a distance between the substrate outer periphery and an electric-wire connection part.

TABLE 1

| Distance (mm) | Resistance (MΩ) |
| --- | --- |
| 5.5 | 100 |
| 8 | 350 |

TABLE 1-continued

| Distance (mm) | Resistance (MΩ) |
| --- | --- |
| 10 | 380 |
| 11 | 430 |
| 12 | 510 |
| 14.2 | 550 |

In order to measure the resistance, a positive (+) terminal and a negative (−) terminal were connected to the electric-wire connection part and then connected to a positive (+) terminal of an insulation resistance tester, a negative (−) terminal of the insulation resistance tester was connected to a substrate, and then a DC voltage of 500 V was applied. Thereafter, a resistance according to a distance A1 between the electric-wire connection part and the first substrate outer periphery was measured.

As a result, it may be seen that a resistance of 500 MΩ or more is obtained under the DC voltage of 500 V when the distance A1 between the electric-wire connection part and the first substrate outer periphery is greater than or equal to 12 mm.

Figure 13:
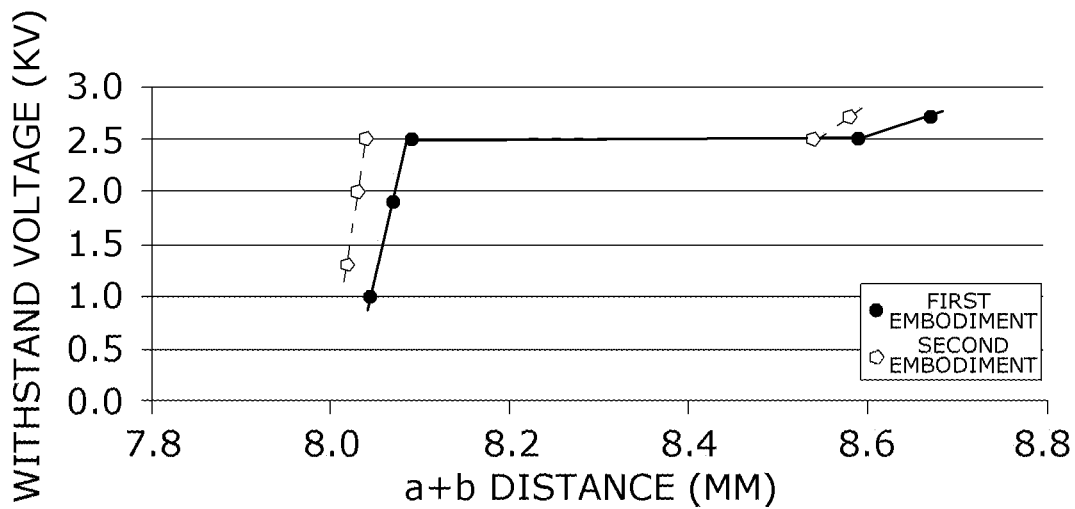
FIG. 13 is a graph illustrating a result of measuring a withstand voltage according to a distance between an edge of a hole and an electrode.
Figure 14:
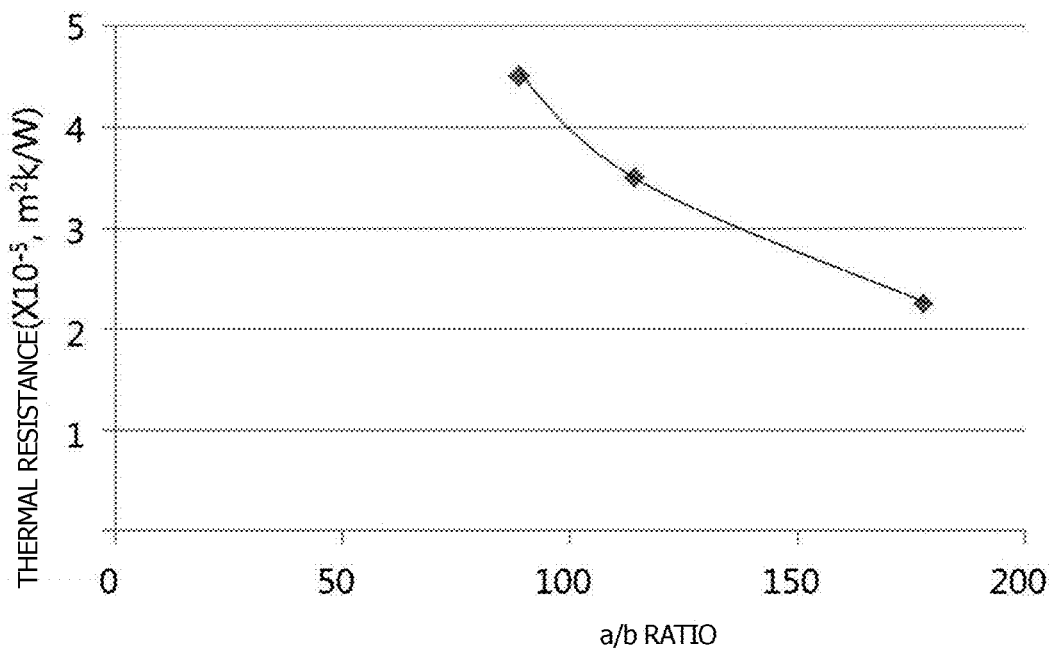
FIG. 14 is a graph illustrating a result of measuring a thermal resistance according to a distance between the edge of the hole and the electrode for a thickness of an insulating layer.

Table 2 and FIG. 13 illustrate a result of measuring a withstand voltage according to a distance between the edge of the hole and the electrode, and Table 3 and FIG. 14 illustrate a result of measuring a thermal resistance according to the distance between the edge of the hole and the electrode for a thickness of the insulating layer.

TABLE 2

| Distance a between electrode and hole (mm) | Insulating layer thickness (first embodiment, μm) | Insulating layer thickness (second embodiment, μm) | a + b (mm) | Withstand voltage (kV) | a/b |
| --- | --- | --- | --- | --- | --- |
| 0.5 | 45 | — | 0.545 | 0.5 | — |
| 0.5 | 95 | — | 0.59 | 0.5 | — |
| 8 | 45 | — | 8.045 | 1.0 | 178 |
| 8 | 70 | — | 8.07 | 1.9 | 114 |
| 8 | 90 | — | 8.09 | 2.5 | 89 |
| 8.5 | 90 | — | 8.59 | 2.5 | 94 |
| 0.5 | — | 20 | 0.52 | 0.7 | — |
| 0.5 | — | 40 | 0.54 | 1.3 | — |
| 8 | — | 20 | 8.02 | 1.3 | 400 |
| 8 | — | 40 | 8.04 | 2.5 | — |
| 8.5 | — | 40 | 8.54 | 2.5 | — |
| 8.5 | — | 80 | 8.58 | 2.7 | 106 |

Here, the withstand voltage performance measurement was performed by disposing the insulating layer on the substrate, connecting one terminal to the substrate and connecting another terminal to each of 9 points on the insulating layer, and then measuring the voltage maintained without insulation breakdown for 10 seconds under a current of 1 mA, and was made for a first embodiment in which aluminum or aluminum oxide was not included in the first insulating layer and a second embodiment in which aluminum or aluminum oxide was included in the first insulating layer.

Referring to Table 2 and FIG. 13, it may be seen that in both the first and second embodiments, withstand voltage characteristics of 1 kV or more may be obtained when the shortest distance a between the edge of the first through-hole 700 and the first electrode is greater than or equal to 8 mm.

Meanwhile, referring to FIG. 14, it may be seen that the thermal resistance increases as the ratio of the shortest distance a between the edge of the first through-hole 700 and the plurality of first electrodes 230 to the thickness b of the first insulating layer 220 is reduced, and accordingly, the heat transfer characteristics are degraded, and the thermal resistance decreases as the ratio of the shortest distance a between the edge of the first through-hole 700 and the plurality of first electrodes 230 to the thickness b of the first insulating layer 220 is increased, and accordingly, the heat transfer characteristics are improved.

Accordingly, when the shortest distance a between the edge of the first through-hole 700 and the plurality of first electrodes 230 is 50 times or more, and preferably 50 to 180 times or more the thickness b of the first insulating layer 220, the withstand voltage characteristics and the heat transfer characteristics may be simultaneously satisfied.

The thermoelectric element according to the embodiment of the present disclosure may be applied to power generation devices, cooling devices, heating devices, and the like.

According to the embodiment of the present disclosure, a thermoelectric element with excellent performance and high reliability can be provided. In particular, according to the embodiment of the present disclosure, a thermoelectric element with improved thermal conduction performance as well as improved withstand voltage performance and insulation resistance can be provided. Accordingly, withstand voltage characteristics, which are additionally required in an application under a high-voltage environment, can be satisfied.

A thermoelectric element according to the embodiment of the present disclosure can be applied to an application implemented in large size such as vehicles, vessels, a steel mill, an incinerator, and the like, as well as an application implemented in small size.

Although the exemplary embodiments of the present disclosure have been described above, it may be understood by those skilled in the art that a variety of modifications and changes may be made without departing from the concept and scope of the present disclosure disclosed within the range of the following claims.

What is claimed is:

1. A thermoelectric element comprising:
   a first metal substrate including a first through-hole formed therein;
   a first insulating layer disposed on the first metal substrate and including a second through-hole formed at a position corresponding to the first through-hole;
   a first electrode part disposed on the first insulating layer and including a plurality of first electrodes;
   a semiconductor structure disposed on the first electrode part;
   a second electrode part disposed on the semiconductor structure and including a plurality of second electrodes;
   a second insulating layer disposed on the second electrode part; and
   a second metal substrate disposed on the second insulating layer,
   wherein the first metal substrate includes a first outer periphery, a second outer periphery, a third outer periphery, and a fourth outer periphery which define a shape of the first metal substrate,
   wherein the first outer periphery and the fourth outer periphery are opposite to each other,
   wherein the second outer periphery and the third outer periphery are opposite to each other between the first outer periphery and the fourth outer periphery,
   wherein the first electrode part includes a first region vertically overlapping the plurality of second electrodes,
   wherein the first insulating layer has a first surface which is to face the second metal substrate and a second surface which is to face the first metal substrate,
   wherein at least one of the plurality of first electrodes includes an extension portion extending from the first region toward the first outer periphery such that the extension portion is provided on the first surface of the first insulating layer,
   the extension portion includes a first end and a second end,
   wherein both of the first end and the second end of the extension portion are disposed on the first surface of the first insulating layer, and on the first metal substrate such that the first insulating layer is disposed between the first metal substrate and the first end of the extension portion and is disposed between the first metal substrate and the second end of the extension portion,
   wherein a first one of the plurality of first electrodes has a first lateral surface closest to the second through-hole between the second outer periphery and the second through-hole, the first lateral surface facing the second through-hole, the first one has a second lateral surface facing the second outer periphery and a first end surface between an end of the first lateral surface and an end of the second lateral surface, the first end surface facing the first outer periphery,
   wherein a shortest distance between the second outer periphery of the first metal substrate and the first lateral surface of the first one is 90% to 110% of a shortest distance between the second outer periphery of the first metal substrate and the extension portion,
   wherein a first part of the first surface of the first insulating layer is to face the first region of the first electrode part, and a second part of the first surface of the first insulating layer is to face the extension portion,
   wherein a shortest distance between the second outer periphery of the first metal substrate and the first part of the first surface of the first insulating layer is shorter than a shortest distance between the second outer periphery of the first metal substrate and the second part of the first surface of the first insulating layer, and
   wherein a shortest distance between the first outer periphery of the first metal substrate and the first part of the first surface of the first insulating layer is longer than a shortest distance between the first outer periphery of the first metal substrate and the second part of the first surface of the first insulating layer,
   wherein an insulation resistance of the thermoelectric element is 500 MΩ or more, when a direct current (DC) voltage of 500 V is applied to the thermoelectric element.

2. The thermoelectric element of claim 1, wherein
   a first hole arrangement region is formed in the inside of the first region,
   the first hole arrangement region is a space formed based on four electrodes, which are adjacent to the second through-hole, among the plurality of first electrodes surrounding a periphery of the second through-hole, the four electrodes includes the first one, a second one, a third one and a fourth one,
   wherein the first one has a first lateral surface closest to the second through hole, and a first virtual line extends in a first direction along the first lateral surface of the first one,
   the second one has a third lateral surface facing the second through hole, a fourth lateral surface facing the fourth outer periphery, and a second end surface between an end of the third lateral surface and an end of the fourth lateral surface, the second end surface facing the second outer periphery, and a second virtual line extends in a second direction along the third lateral surface, the second direction being transverse to the first direction, the third one has a fifth lateral surface closest to the second through hole, and a third virtual line extends in a third direction along the fifth lateral surface, the third direction being parallel to the first direction, the fourth one has a sixth lateral surface closest to the second through hole, and a fourth virtual line extends in a fourth direction along the sixth lateral surface, the fourth direction being parallel to the second direction, and the space of the first hole arrangement region is within an area defined by the first virtual line, the second virtual line, the third virtual line and the fourth virtual line, and the extension portion is disposed so that at least a portion thereof overlaps, in the second direction or the fourth direction, a space formed by extension lines extending from the first and third virtual lines that define the first hole arrangement region.

3. The thermoelectric element of claim 2, wherein a shortest distance between the first region and the first outer periphery is 1.2 to 2.5 times the shortest distance between the second outer periphery and the extension portion.

4. The thermoelectric element of claim 3, wherein the shortest distance between the second outer periphery and the extension portion is greater than or equal to 12 mm.

5. The thermoelectric element of claim 2, wherein a shortest distance between an edge of the second through-hole and the first lateral surface of the first one is 50 to 180 times a thickness of the first insulating layer.

6. The thermoelectric element of claim 5, wherein the shortest distance between the edge of the second through-hole and the first lateral surface of the first one is greater than or equal to 8 mm.

7. The thermoelectric element of claim 2, wherein
the second insulating layer includes a third through-hole formed at a position corresponding to the first through-hole,
the second metal substrate includes a fourth through-hole formed at a position corresponding to the first through-hole, and
the thermoelectric element further comprises a coupling member disposed between the first through-hole and the fourth through-hole.

8. The thermoelectric element of claim 7, further comprising a heat sink disposed on the second metal substrate and including a fifth through-hole formed at a position corresponding to the first through-hole.

9. The thermoelectric element of claim 8, wherein the coupling member is disposed between the fourth through-hole and the fifth through-hole, and the thermoelectric element further comprises an insulating insertion member disposed to be adjacent to the fifth through-hole on the heat sink.

10. The thermoelectric element of claim 9, wherein a portion of the insulating insertion member is disposed between the fourth through-hole and the coupling member.

11. The thermoelectric element of claim 10, wherein a diameter of the fourth through-hole is 1.1 to 2.0 times a diameter of the first through-hole.

12. The thermoelectric element of claim 7, further comprising a third insulating layer disposed between the first insulating layer and the first electrode part and including a sixth through-hole formed at a position corresponding to the first through-hole.

13. The thermoelectric element of claim 12, wherein at least one of the first insulating layer, the second insulating layer, and the third insulating layer includes a resin and an inorganic material.

14. The thermoelectric element of claim 13, wherein the inorganic material includes aluminum or aluminum oxide.

15. The thermoelectric element of claim 2, wherein an area of the first hole arrangement region is four times or more than an area of the first one.

16. The thermoelectric element of claim 1, wherein
the extension portion includes a first terminal electrode and a second terminal electrode on the second part of the first surface of the first insulating layer,
a first connection unit is disposed on the first terminal electrode, and
a second connection unit is disposed on the second terminal electrode.

17. The thermoelectric element of claim 16, wherein each of the first connection unit and the second connection unit is a connector connected to an electric wire.

18. A power generation device comprising:
a first fluid flow part in which a first fluid flows;
a second fluid flow part in which a second fluid having a higher temperature than the first fluid flows; and
a thermoelectric element disposed between the first fluid flow part and the second fluid flow part,
wherein the thermoelectric element includes:
a first metal substrate including a first through-hole formed therein;
a first insulating layer disposed on the first metal substrate and including a second through-hole formed at a position corresponding to the first through-hole;
a first electrode part disposed on the first insulating layer and including a plurality of first electrodes;
a semiconductor structure disposed on the first electrode part;
a second electrode part disposed on the semiconductor structure and including a plurality of second electrodes;
a second insulating layer disposed on the second electrode part; and
a second metal substrate disposed on the second insulating layer,
wherein the first metal substrate includes a first outer periphery, a second outer periphery, a third outer periphery, and a fourth outer periphery which define a shape of the first metal substrate,
wherein the first outer periphery and the fourth outer periphery are opposite to each other,
wherein the second outer periphery and the third outer periphery are opposite to each other between the first outer periphery and the fourth outer periphery,
wherein the first electrode part includes a first region vertically overlapping the plurality of second electrodes,
wherein the first insulating layer has a first surface which is to face the second metal substrate and a second surface which is to face the first metal substrate,
wherein at least one of the plurality of first electrodes includes an extension portion extending from the first region toward the first outer periphery such that the extension portion is provided on the first surface of the first insulating layer, the extension portion includes a first end and a second end, wherein both of the first end and the second end of the extension portion are disposed on the first surface of the first insulating layer and on the first metal substrate such that the first insulating layer is disposed between the first metal substrate and the first end of the extension portion and is disposed between the first metal substrate and the second end of the extension portion, wherein a first one of the plurality of first electrodes has a first lateral surface closest to the second through-hole between the second outer periphery and the second through-hole, the first lateral surface facing the second through-hole, the first one has a second lateral surface facing the second outer periphery and a first end surface between an end of the first lateral surface and an end of the second lateral surface, the first end surface facing the first outer periphery, wherein a shortest distance between the second outer periphery of the first metal substrate and the first lateral surface of the first one is 90% to 110% of a shortest distance between the second outer periphery of the first metal substrate and the extension portion, wherein a first part of the first surface of the first insulating layer is to face the first region of the first electrode part, and a second part of the first surface of the first insulating layer is to face the extension portion, wherein a shortest distance between the second outer periphery of the first metal substrate and the first part of the first surface of the first insulating layer is shorter than a shortest distance between the second outer periphery of the first metal substrate and the second part of the first surface of the first insulating layer, and wherein a shortest distance between the first outer periphery of the first metal substrate and the first part of the first surface of the first insulating layer is longer than a shortest distance between the first outer periphery of the first metal substrate and the second part of the first surface of the first insulating layer, wherein an insulation resistance of the thermoelectric element is 500 MΩ, or more, when a direct current (DC) voltage of 500 V is applied to the thermoelectric element.

19. The power generation device of claim 18, wherein the shortest distance between the second outer periphery and the extension portion is greater than or equal to 12 mm.

20. The power generation device of claim 18, wherein a shortest distance between an edge of the second through-hole and the first lateral surface of the first one is greater than or equal to 8 mm.

* * * * *